(12) United States Patent
Becker et al.

(10) Patent No.: US 12,526,927 B2
(45) Date of Patent: Jan. 13, 2026

(54) ENHANCED CONTROL USING AI IN APPARATUS HAVING IR CAMERA HEAT DETECTION SYSTEM

(71) Applicant: Illinois Tool Works Inc., Glenview, IL (US)

(72) Inventors: Eric Wayne Becker, Phillipsburg, MO (US); Hasan Imamus Saleheen, Millbury, MA (US)

(73) Assignee: Illinois Tool Works Inc., Glenview, IL (US)

( * ) Notice: Subject to any disclaimer, the term of this patent is extended or adjusted under 35 U.S.C. 154(b) by 133 days.

(21) Appl. No.: 18/162,413

(22) Filed: Jan. 31, 2023

(65) Prior Publication Data

US 2023/0180395 A1  Jun. 8, 2023

Related U.S. Application Data

(63) Continuation-in-part of application No. 17/511,907, filed on Oct. 27, 2021, now Pat. No. 12,205,835.
(Continued)

(51) Int. Cl.
*H05K 3/34* (2006.01)

(52) U.S. Cl.
CPC ........... *H05K 3/3494* (2013.01); *H05K 3/341* (2013.01)

(58) Field of Classification Search
CPC .... H05K 3/3494; H05K 3/341; B23K 1/0016; B23K 1/008
See application file for complete search history.

(56) References Cited

U.S. PATENT DOCUMENTS

| | | |
|---|---|---|
| 4,969,035 A | 11/1990 | Dawson |
| 6,168,064 B1 | 1/2001 | Berkin |

(Continued)

FOREIGN PATENT DOCUMENTS

| | | |
|---|---|---|
| CN | 103231139 A | 8/2013 |
| CN | 103648700 A | 3/2014 |

(Continued)

OTHER PUBLICATIONS

Search Report from Taiwanese Application No. 110145015 dated Feb. 4, 2025.

(Continued)

*Primary Examiner* — Mohammed Shamsuzzaman
(74) *Attorney, Agent, or Firm* — Lando & Anastasi, LLP

(57) ABSTRACT

A method of joining electronic components to an electronic substrate in an apparatus includes: (1) transporting electronic substrates through a chamber housing including a tunnel extending through multiple processing zones; (2) detecting temperatures of the electronic substrates passing proximate to a heat detection system including at least one temperature sensor coupled to the chamber housing; (3) receiving temperature data from the heat detection system with a controller coupled to the multiple processing zones, the conveyor, and the heat detection system; (4) determining, by the controller, with reference to the detected temperatures of the electronic substrates, an adjustment to at least one of (a) a heat setting of a heating element within the chamber housing, (b) a speed of the conveyor, and (c) an operational speed of a blower within the chamber housing; and (5) performing the determined adjustment.

9 Claims, 9 Drawing Sheets

Related U.S. Application Data

(60) Provisional application No. 63/120,971, filed on Dec. 3, 2020.

(56) References Cited

U.S. PATENT DOCUMENTS

| | | | |
|---|---|---|---|
| 6,360,935 B1 | 3/2002 | Flake | |
| 8,110,015 B2 * | 2/2012 | Neiderman | B23K 1/018 95/288 |
| 9,997,850 B2 * | 6/2018 | Hong | H01R 12/724 |
| 2016/0107253 A1 | 4/2016 | Kuhn et al. | |
| 2017/0032281 A1 * | 2/2017 | Hsu | G06Q 10/06 |
| 2017/0127700 A1 * | 5/2017 | Armstrong | A23L 5/10 |
| 2021/0392756 A1 * | 12/2021 | Ghosh | H05K 13/0817 |
| 2022/0181177 A1 | 6/2022 | Becker | |
| 2023/0053878 A1 * | 2/2023 | Bönig | G06T 7/001 |
| 2023/0180395 A1 | 6/2023 | Becker et al. | |

FOREIGN PATENT DOCUMENTS

| | | | | |
|---|---|---|---|---|
| CN | 110671932 A | | 1/2020 | |
| CN | 110934508 A | * | 3/2020 | H05K 1/0266 |
| CN | 116648321 A | * | 8/2023 | B23K 1/0016 |
| EP | 0862962 A2 | * | 9/1998 | B23K 1/008 |
| EP | 4138032 A1 | * | 2/2023 | G06T 7/001 |
| FR | 2641870 A1 | * | 7/1990 | G01N 25/72 |
| JP | 10209629 A | * | 8/1998 | H05K 1/0266 |
| JP | H10209629 A | * | 8/1998 | H05K 1/0266 |
| JP | H10322015 A | | 12/1998 | |
| JP | 2000277906 A | | 10/2000 | |
| JP | 2000332404 A | * | 11/2000 | H05K 1/0266 |
| JP | 2008210946 A | | 9/2008 | |
| JP | 2018085485 A | | 5/2018 | |
| WO | WO-2021228540 A1 | * | 11/2021 | H05K 1/0266 |
| WO | 2022120069 A1 | | 6/2022 | |
| WO | 2022241427 A1 | | 11/2022 | |

OTHER PUBLICATIONS

International Search Report and Written Opinion from corresponding International Application No. PCT/US2023/037067, dated Mar. 14, 2024.

* cited by examiner

ENHANCED CONTROL USING AI IN APPARATUS HAVING IR CAMERA HEAT DETECTION SYSTEM

CROSS-REFERENCE TO RELATED APPLICATIONS

This application claims priority under 35 U.S.C. § 119(e) to both U.S. Provisional Application Ser. No. 63/120,971, titled "APPARATUS HAVING CLOSED LOOP IR CAMERA HEAT DETECTION SYSTEM AND METHOD," filed on Dec. 3, 2020; and to U.S. patent application Ser. No. 17/511,907, titled "APPARATUS HAVING CLOSED LOOP IR CAMERA HEAT DETECTION SYSTEM AND METHOD," filed on Oct. 27, 2021, both of which are incorporated herein by reference in their entirety for all purposes.

BACKGROUND OF THE DISCLOSURE

1. Field of the Disclosure

This application relates generally to the surface mount of electronic components onto a printed circuit board by employing an assembly process, such as a reflow process, a wave soldering process, and/or a selective soldering process, and more particularly to an apparatus that is designed to control heat applied to the printed circuit board during the assembly process.

2. Discussion of Related Art

In the fabrication of printed circuit boards, electronic components are often surface mounted to a bare board by a process known as "reflow soldering." In a typical reflow soldering process, a pattern of solder paste is deposited onto the circuit board, and the leads of one or more electronic component are inserted into the deposited solder paste. The circuit board is then passed through an oven where the solder paste is reflowed (i.e., heated to a melt or reflow temperature) in the heated zones and then cooled in a cooling zone to electrically and mechanically connect the leads of the electronic component to the circuit board. The term "circuit board" or "printed circuit board," as used herein, includes any type of substrate assembly of electronic components, including, for example, wafer substrates.

As stated above, present day reflow ovens have heating and cooling chambers. To achieve a consistent reflow process profile, heat applied to the electronic components and the circuit boards is precisely controlled to ensure proper mechanical and electrical connection of the electronic components to the circuit boards.

Moreover, in the fabrication of printed circuit boards, electronic components can be mounted to circuit boards by a process known as "wave soldering." In a typical wave solder machine, the circuit boards are moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered. As with reflow ovens, wave solder machines (and selective solder machines) require that the heat of each zone is precisely controlled to ensure proper mechanical and electrical connection of the electronic components to the circuit boards.

For both reflow ovens and wave (and selective) solder machines, controlling heat in the zones of the respective equipment is very important for optimum performance. For example, undesirable temperature variance can cause warpage of the circuit board and unreliable connections between the electronic components and the circuit board.

SUMMARY OF THE DISCLOSURE

One aspect of the present disclosure is directed to a reflow oven configured to join electronic components to an electronic substrate. In one embodiment, the reflow oven comprises a chamber housing including a tunnel extending through multiple processing zones, a conveyor configured to transport electronic substrates in the tunnel through the multiple processing zones, and a heat detection system including at least one temperature sensor coupled to the chamber housing. The at least one temperature sensor is configured to detect temperatures of the electronic substrates passing proximate to the at least one temperature sensor. The reflow oven further comprises a controller coupled to the multiple processing zones, the conveyor and the heat detection system. The controller is configured to receive temperature data from the heat detection system.

Embodiments of the reflow oven further may include the at least one temperature sensor having at least one sensor assembly. The at least one sensor assembly may include a support structure, a support bracket coupled to the support structure, and an IR camera secured to the support bracket. The support structure may include a shroud that is mounted on the mounting plate. The shroud may be configured to surround an opening within a top of the tunnel to enable a temperature of the tunnel to be sensed by the IR camera. The support bracket may include a port to connect to a source of inert gas. The support bracket may include a glass cover to protect the IR camera. The support bracket may be configured to mount the IR camera on top of the tunnel at a desired height and a desired orientation to achieve a full field of view. The at least one sensor assembly may include multiple IR cameras to measure two or more separate locations within select locations within the tunnel. The heat detection system may be configured with the controller to provide closed loop control of the zone temperatures of the multiple processing zones using the sensor assembly. The at least one sensor assembly may be configured to obtain temperature data at specific electronic substrate level locations and in certain processing zones of the reflow soldering oven. Temperature data may be used to provide electronic substrate traceability in which data on a particular electronic substrate is provided on a display associated with the controller. Temperature data may be used to find hot spot zones/levels within the reflow soldering oven. Temperature data may be used to optimize the performance of the reflow soldering oven and/or to provide downstream input of processing equipment and/or to determine start and end times of scanning performed by the at least one sensor assembly on electronic substrates and/or to generate electronic substrate profiles above and below the electronic substrate. The closed loop control may include controlling a speed of the conveyor in the multiple processing zones. The electronic substrates each may include a bar code that is scanned by a bar code scanner. The controller may be configured to achieve a scan mode to measure the temperature of components of the electronic substrates as the electronic substrates travel on the conveyor through the reflow soldering oven.

Another aspect of the present disclosure is directed to method of joining electronic components to an electronic substrate in a reflow oven. In one embodiment, the method comprises: transporting electronic substrates through a chamber housing including a tunnel extending through multiple processing zones; detecting temperatures of the electronic substrates passing proximate to a heat detection system including at least one temperature sensor coupled to the chamber housing; and receiving temperature data from the heat detection system with a controller coupled to the multiple processing zones, the conveyor and the heat detection system.

Embodiments of the method further may include scanning a bar code associated with each substrate by a bar code scanner and/or controlling the reflow soldering oven to achieve a scan mode to measure the temperature of components of the electronic substrates as the electronic substrates travel on the conveyor through the reflow soldering oven. The heat detection system may be configured with the controller to provide closed loop control of the zone temperatures of the multiple processing zones using the sensor assembly. The at least one sensor assembly may be configured to obtain temperature data at specific electronic substrate level locations and in certain processing zones of the reflow soldering oven. Temperature data may be used to provide electronic substrate traceability in which data on a particular electronic substrate is provided on a display associated with the controller. Temperature data may be used to find hot spot zones/levels within the reflow soldering oven. Temperature data may be used to optimize the performance of the reflow soldering oven and/or to provide downstream input of processing equipment and/or to determine start and end times of scanning performed by the at least one sensor assembly on electronic substrates and/or to generate electronic substrate profiles above and below the electronic substrate. The closed loop control may include controlling a speed of the conveyor in the multiple processing zones. The method further may include scanning a bar code associated with each substrate by a bar code scanner. The method further may include controlling the reflow soldering oven to achieve a scan mode to measure the temperature of components of the electronic substrates as the electronic substrates travel on the conveyor through the reflow soldering oven.

Yet another aspect of the present disclosure is directed to a wave solder or selective solder machine configured to join electronic components to an electronic substrate. In one embodiment, the reflow oven comprises a chamber housing including a tunnel extending through multiple processing zones, a conveyor configured to transport electronic substrates in the tunnel through the multiple processing zones, and a heat detection system including at least one temperature sensor coupled to the chamber housing. The at least one temperature sensor is configured to detect temperatures of the electronic substrates passing proximate to the at least one temperature sensor. The wave solder or selective solder machine further comprising a controller coupled to the multiple processing zones, the conveyor and the heat detection system. The controller is configured to receive temperature data from the heat detection system. The at least one temperature sensor may include at least one sensor assembly. The at least one sensor assembly may include a support structure, a support bracket coupled to the support structure, and an IR camera secured to the support bracket. The support structure may include a mounting plate that is positioned on a top of the tunnel and a shroud that is mounted on the mounting plate. The shroud may be configured to surround an opening within the mounting plate to enable a temperature of the tunnel to be sensed by the IR camera. The support bracket may include a port to connect to a source of inert gas. The support bracket may include a glass cover to protect the IR camera. The support bracket may be configured to mount the IR camera on top of the tunnel at a desired height and a desired orientation to achieve a full field of view. The at least one sensor assembly may include multiple IR cameras to measure two or more separate locations within select locations within the tunnel. The heat detection system may be configured with the controller to provide closed loop control of the zone temperatures of the multiple processing zones using the at least one sensor assembly. The at least one sensor assembly may be configured to obtain temperature data at specific electronic substrate level locations and in certain processing zones of the reflow soldering oven. Temperature data may be used to provide electronic substrate traceability in which data on a particular electronic substrate is provided on a display associated with the controller. Temperature data may be used to find hot spot zones/levels within the wave solder or selective solder machine. Temperature data may be used to optimize the performance of the wave solder or selective solder machine and/or to provide downstream input of processing equipment and/or to determine start and end times of scanning performed by the at least one sensor assembly on electronic substrates and/or to generate electronic substrate profiles above and below the electronic substrate. The closed loop control may include controlling a speed of the conveyor in the multiple processing zones. The electronic substrates each may include a bar code that is scanned by a bar code scanner. The controller may be configured to achieve a scan mode to measure the temperature of components of the electronic substrates as the electronic substrates travel on the conveyor through the wave solder or selective solder machine.

Another aspect of the present disclosure is directed to a method of joining electronic components to an electronic substrate in a wave solder or selective solder machine. In one embodiment, the method comprises: transporting electronic substrates through a chamber housing including a tunnel extending through multiple processing zones; detecting temperatures of the electronic substrates passing proximate to a heat detection system including at least one temperature sensor coupled to the chamber housing; and receiving temperature data from the heat detection system with a controller coupled to the multiple processing zones, the conveyor and the heat detection system.

Embodiments of the method further may include scanning a bar code associated with each substrate by a bar code scanner and/or controlling the machine to achieve a scan mode to measure the temperature of components of the electronic substrates as the electronic substrates travel on the conveyor through the machine. The heat detection system may be configured with the controller to provide closed loop control of the zone temperatures of the multiple processing zones using the sensor assembly. The at least one sensor assembly may be configured to obtain temperature data at specific electronic substrate level locations and in certain processing zones of the machine. Temperature data may be used to provide electronic substrate traceability in which data on a particular electronic substrate is provided on a display associated with the controller. Temperature data may be used to find hot spot zones/levels within the machine. Temperature data may be used to optimize the performance of the machine and/or to provide downstream input of processing equipment and/or to determine start and end times of scanning performed by the at least one sensor assembly on electronic substrates and/or to generate electronic substrate profiles above and below the electronic substrate. The closed loop control may include controlling a speed of the conveyor in the multiple processing zones.

Another aspect of the present disclosure is directed to an apparatus configured to join electronic components to an electronic substrate. In one embodiment, the apparatus comprises a chamber housing including a tunnel extending through multiple processing zones, a conveyor configured to transport electronic substrates in the tunnel through the multiple processing zones, and a heat detection system including at least one temperature sensor coupled to the chamber housing. The at least one temperature sensor is configured to detect temperatures of the electronic substrates passing proximate to the at least one temperature sensor. The apparatus further includes a controller coupled to the multiple processing zones, the conveyor and the heat detection system. The controller is configured to receive temperature data from the heat detection system.

Yet another aspect of the disclosure is directed to a method of joining electronic components to an electronic substrate in an apparatus. In one embodiment, the method comprises: transporting electronic substrates through a chamber housing including a tunnel extending through multiple processing zones; detecting temperatures of the electronic substrates passing proximate to a heat detection system including at least one temperature sensor coupled to the chamber housing; and receiving temperature data from the heat detection system with a controller coupled to the multiple processing zones, the conveyor and the heat detection system.

Another aspect of the present disclosure is directed to method of joining electronic components to an electronic substrate in an apparatus. In one embodiment, the method comprises: (1) transporting electronic substrates through a chamber housing including a tunnel extending through multiple processing zones; (2) detecting temperatures of the electronic substrates passing proximate to a heat detection system including at least one temperature sensor coupled to the chamber housing; (3) receiving temperature data from the heat detection system with a controller coupled to the multiple processing zones, the conveyor, and the heat detection system; (4) determining, by the controller, with reference to the detected temperatures of the electronic substrates, an adjustment to at least one of (a) a heat setting of a heating element within the chamber housing, (b) a speed of the conveyor, and (c) an operational speed of a blower within the chamber housing; and (5) performing the determined adjustment. Yet another aspect of the disclosure is directed to a corresponding apparatus. Yet another aspect of the disclosure is directed to a corresponding computer program product.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
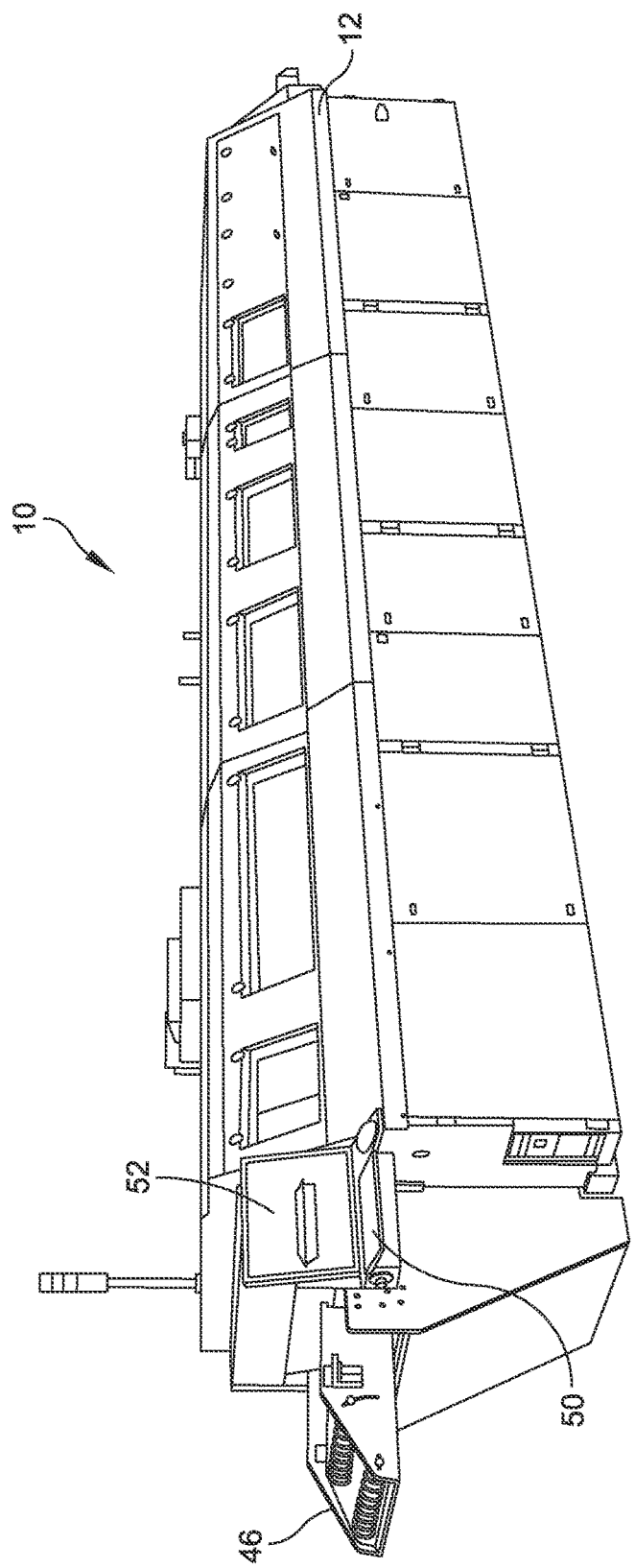
FIG. 1 is a perspective view of a reflow soldering oven of an embodiment of the present disclosure.

Solder paste is routinely used in the assembly of printed circuit boards, where the solder paste is used to join electronic components to the circuit board. Solder paste includes solder for joint formation and flux for preparing metal surfaces for solder attachment. The solder paste may be deposited onto the metal surfaces (e.g., electronic pads) provided on the circuit board by using any number of application methods. In one example, a stencil printer may employ a squeegee to force the solder paste through a metallic stencil laid over an exposed circuit board surface. In another example, a dispenser may dispense solder paste material onto specific areas of the circuit board. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the circuit board. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used.

Temperature control of the soldering process is very important. In one embodiment of the present disclosure, a heat detection system having several infrared (IR) cameras is used to precisely measure the temperature of the circuit board within strategic locations of the reflow soldering oven. The information obtained from the IR cameras of the heat detection system can be used to provide closed-loop control of the reflow oven to ensure proper connections between electronic components and circuit boards. Other types of temperature measuring devices can be employed in place of the IR cameras. For example, laser temperature sensors can be used as part of the heat detection system. Moreover, the techniques described herein can be used for other types of circuit board processing equipment, such as wave solder machines and selective solder machines, to achieve improved temperature control.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Reflow Soldering Oven

In the reflow process, a circuit printed board is heated for approximately 3-5 minutes according a pre-defined temperature profile. The complete assembly (including board material, components, and solder paste) should reach a minimum reflow temperature, but should not be overheated. Overheating may damage components and result in solder defects. To achieve this heating curve, the reflow soldering oven contains multiple heating and cooling zones. The zones blow hot or cold gas toward the circuit board. The gas temperature set-points of these zones in combination with the conveyor speed defines the final heating profile of the circuit board assembly.

To ensure that the reflow soldering oven is operating correctly, a printed circuit board is provided with thermocouples to record the temperature of the circuit board over time. The thermocouples are placed on the coldest and hottest locations of the circuit board assembly and on critical components to make sure that the components are not overheated. Once the set-points and conveyor speed are determined to be within an acceptable specification, the oven contains controls and thermal probes to maintain the temperatures of the zones within the acceptable boundaries. During production there may be circuit boards with thermocouples that are run through the reflow soldering oven to assure that all predefined conditions are still within the acceptable specification. A shortcoming of existing process control is that there is no temperature control on the circuit board assemblies during the reflow process. Inspection of the components and solder joints of the circuit boards occur after soldering; however, there is no verification during the time the circuit boards are heated.

Existing process control is directed to maintaining the zone temperatures and conditions within specification using thermo probes that measure the gas temperatures but not the actual temperature on the circuit board assemblies. There is thermal profiling hardware available that have software tools that help to define, measure, monitor and improve thermal processes for electronic manufacturing services. These systems make the reflow soldering ovens smarter and reduce defects because of better process control. The intelligent software makes modifications to the oven settings when required to guarantee consistent board temperatures and solder quality.

Despite of the intelligent systems and process control of the reflow soldering oven, there is no verification of the actual temperatures of the circuit board assemblies during soldering. The implementation of a heat detection system that can obtain thermal images of the circuit board assemblies during the reflow will add value to process control preventing component damage and reducing solder defects.

Embodiments of the present disclosure are directed to a heat detection system having several IR camera assemblies strategically positioned within the reflow soldering oven to obtain closed loop temperature control of the oven. In one embodiment, a lens of the IR camera assembly is kept clean to enable making accurate temperature images. The IR camera assembly includes a special chamber in front of the lens where nitrogen is purged into to generate an overpressure avoiding the flux contaminated gasses to condensate on the lens. Another method disclosed herein to maintain a clean lens from flux residues is to have a transparent foil in front of the lens on a roll system. Once the foil is dirty, the roll turns to have a new clean transparent spot. Additionally, the reflow soldering oven may contain a catalyst to clean the gas in the zones.

Embodiments of the heat detection system include the use of thermal images to be part of a closed loop system that controls the reflow process. Data from the thermal images are integrated in an intelligent control system of the reflow soldering oven. The camera can be 3D thermal camera or a common 2D camera. The data generated (temperatures of different areas, components, solder paste and board material) can be used for traceability and corrective actions. The reflow process can have multiple cameras. A thermal image scan is a snapshot of the reflow process. However, when there are multiple cameras installed, the collection of snapshots can be used to calculate important process parameters like time above liquidus and peak temperatures. This data can be correlated to defect levels and preventive actions can be sent to printers or dispensers or pick-and-place machines to make necessary modifications.

The image scan also can signal deviations and the reflow soldering oven can respond accordingly. If temperatures are too low or too high, different actions can be taken, such as changing conveyor speed or adjusting the fan speed of one or more heating zones to increase or decrease the heat transfer. Other methods to make temperature corrections are to temporarily stopping the circuit board to become warmer or pushing the circuit board through the zone to achieve a shorter heating time when the circuit board is too hot. These small corrections require free space between the circuit boards. If the board is too cold, IR lamps can be installed in the zones behind a scanner to warm up that particular circuit board faster to be in specification. The tracking system of the oven transport should keep track on the positions of the circuit boards in the reflow soldering oven to make the scan at the right moment. Typically, the conveyor has an encoder or other device that controls speed and defines a position of the circuit board. In one embodiment, additional sensors can be installed near the scanners to locate the circuit boards. The circuit boards can be configured to have barcodes, RFID tags, or some other type of identification traceability.

Embodiments of the heat detection system are configured to obtain image scans to show component alignment during the reflow process and to analyze component movement defects. For example, if there are multiple scanners in the reflow soldering oven, positions within the reflow soldering oven can be defined where the component moves and this may help to avoid this type of defect. Further actions can include replacement of a fan or reducing a fan speed in specific zones of the oven.

Embodiments of the heat detection system further are configured to obtain temperature profiles of circuit boards at strategic points within the reflow soldering oven. This is more accurate than thermocouple profiling, which only returns temperatures of the probes. The position of the probes may not be the most critical spots on the circuit board assemblies and second the thermocouple attachment is critical. A thermocouple may become loose after some runs; however, IR cameras remain accurate over time and are not limited by the number of samples if the lens remains clean.

One embodiment of an exemplary reflow soldering apparatus for soldering the circuit board assembly is shown in FIG. 1. Such apparatuses are sometimes referred to as reflow ovens or reflow soldering ovens in the art of printed circuit board fabrication and assembly. The reflow soldering oven, generally indicated at 10 in FIG. 1, includes a reflow oven chamber 12 in the form of a thermally insulated tunnel defining a passage for pre-heating, reflowing and then cooling solder on a circuit board passing therethrough. The reflow oven chamber 12 extends across a plurality of heating zones, including, in one example, three pre-heat zones 14, 16, 18 followed by three soak zones 20, 22, 24, each zone comprising top and bottom heaters 26, 28, respectively. The soak zones 20, 22, 24 are followed by four spike zones 30, 32, 34, 36, for example, which likewise include heaters 26, 28. And finally, three cooling zones 38, 40, 42 follow the spike zones 30, 32, 34, 36. Other reflow soldering oven configurations can be provided.

A circuit board assembly 44, including deposited solder paste and electronic components, is passed (e.g., left-to-right in FIG. 1) through each zone of the thermally insulated reflow oven chamber 12 on a fixed-speed conveyor, indicated by dashed lines at 46 in FIG. 1, thereby enabling controlled and gradual pre-heat, reflow and post-reflow cooling of the circuit board assembly. It should be understood that the fixed-speed conveyor 46 can be divided up between the zones and embody variable-speed conveyors. In the preliminary pre-heat zones 14, 16, 18, the board assembly is heated from ambient temperature up to the flux activation temperature, which may range between about 130° C. and about 150° C. for lead-based solders and higher for lead-free solders.

In the soak zones 20, 22, 24, variations in temperature across the circuit board assembly are stabilized and time is provided for the activated flux to clean the component leads, electronic pads and solder powder before reflow. Additionally, VOCs in the flux are vaporized. The temperature in the soak zones 20, 22, 24 is typically about 140° C. to about 160° C. for lead-based solders and higher for lead-free solders. In certain embodiments, the circuit board assembly may spend about thirty to about forty-five seconds passing through the soak zones 20, 22, 24.

In the spike zones 30, 32, 34, 36, the temperature quickly increases to a temperature above the melting point of the solder to reflow the solder. The melting point for eutectic or near-eutectic tin-lead solder is about 183° C., with the reflow spike being typically set about 25° C. to about 50° C. above the melting point to overcome a pasty range of molten solder. For lead-based solders, a typical maximum temperature in the spike zones is in the range of about 200° C. to about 220° C. Temperatures above about 225° C. may cause baking of the flux, damage to the components and/or sacrifice joint integrity. Temperatures below about 200° C. may prevent the joints from fully reflowing. In one embodiment, the circuit board assembly is typically maintained at a temperature within the spike zones 30, 32, 34, 36 above the reflow temperature for about one minute.

Next, in the cooling zones 38, 40, 42, the temperature drops below the reflow temperature, and the circuit board assembly is cooled sufficiently to solidify the joints and thereby preserve joint integrity before the circuit board assembly leaves the reflow oven chamber 12.

A flux extraction/filtration system (not shown) may be provided to remove contaminant materials from the gas generated by the reflow soldering oven 10. In one embodiment, an input gas duct may be connected to or between selected zones to provide fluid communication from the reflow oven chamber 12 to the flux extraction/filtration system. An output gas duct may be connected to or between the selected zones to provide fluid communication from the flux extraction/filtration system back to the reflow oven chamber 12. In operation, a vapor stream is withdrawn from the reflow oven chamber 12 through the input gas duct, through the system, then through the output gas duct and back to the reflow oven chamber. Similar constructions of input gas ducts, systems and output gas ducts may be likewise positioned to withdraw vapor streams from or between other zones of the reflow soldering oven 10.

The reflow soldering oven 10 further includes a controller 50 to automate the operation of the several stations of the reflow soldering oven, including but not limited to the top heater 26 and the bottom heater 28 associated with the pre-heat zones 14, 16, 18, the soak zones 20, 22, 24, the spike zones 30, 32, 34, 36, and the cooling zones 38, 40, 42, in the well-known manner. As shown, the controller 50 may include a display 52 with a user interface in which an operator of the reflow soldering machine 10 may control the operation of the machine.

In a certain embodiment, the controller 50 may be configured to use a personal computer having a suitable operating system, such as a Microsoft Windows® operating system provided by Microsoft Corporation, with application specific software to control the operation of the reflow soldering oven 10. The controller 50 may be networked with a master controller that is used to control a production line for fabricating circuit boards. As will be described in greater detail below, the information obtained by the heat detection system can be used by the controller 50 to optimize the performance of the reflow soldering oven 10. This optimization would include an elimination of warpage and the better and more reliable securement of electronic components on the circuit board assembly.

Figure 3:
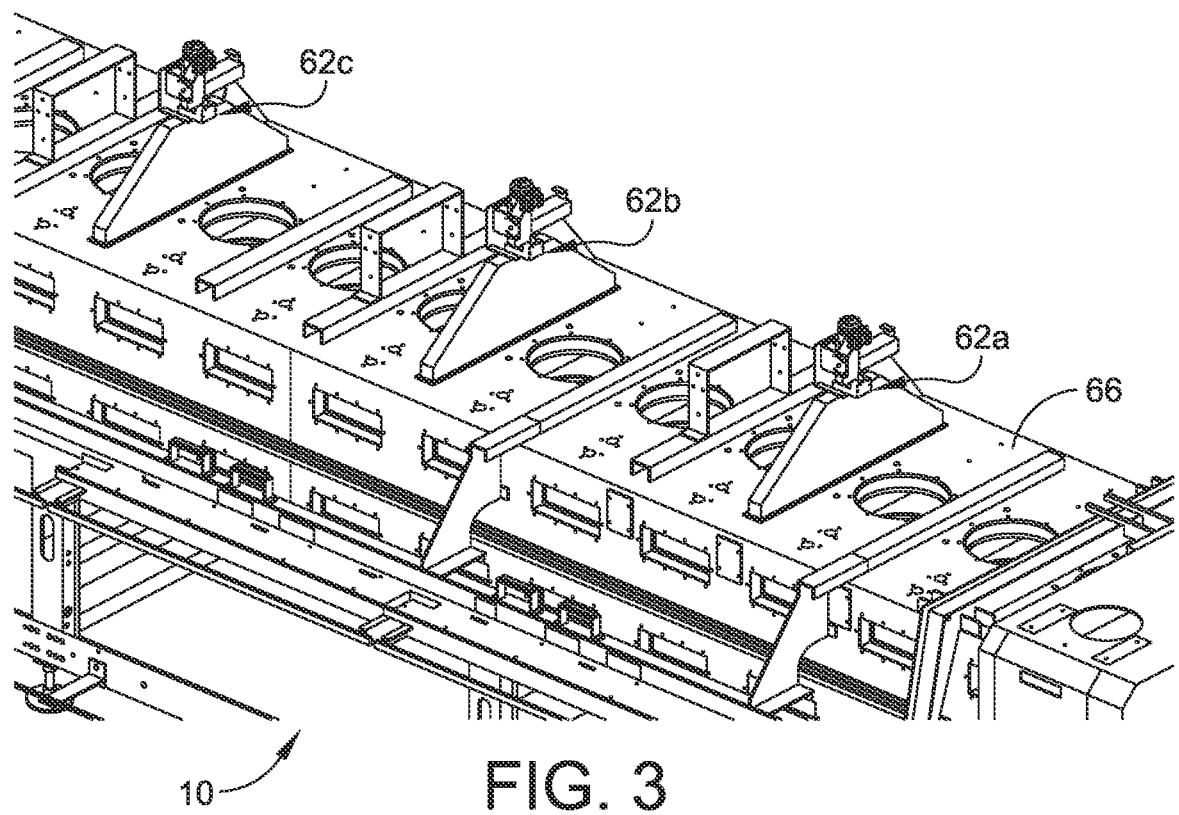
FIG. 3 is a perspective view of a portion of the reflow soldering oven showing a heat detection system of an embodiment of the present disclosure.

Referring to FIG. 3, the reflow soldering oven 10 includes a heat detection system, generally indicated at 60, that is configured to detect heat within the zones of the oven. In the shown embodiment, the heat detection system 60 includes several, e.g., three, sensor assemblies, such as IR camera assemblies, each generally indicated at 62. In this example, a first IR camera assembly 62a is positioned between the $3^{rd}$ and $4^{th}$ zone (the pre-heat zone and the soak zone) of the reflow soldering oven 10, a second IR camera assembly 62b is positioned between the $6^{th}$ and $7^{th}$ zone (the soak zone and the spike zone), and a third IR camera assembly 62c is positioned between the $9^{th}$ and $10^{th}$ zone (the spike zone and the cooling zones). It should be understood that the IR camera assemblies 62 can be deployed anywhere within the reflow soldering oven 10 to optimize the performance of the reflow soldering oven.

Each IR camera assembly 62 is strategically deployed to measure the temperature of a circuit board assembly 44 as it passes between zones to ensure that the circuit board assembly is properly conditioned prior to processing. The information obtained from each IR camera assembly 62 is communicated to the controller 50, which is configured to provide closed loop processing of subsequent circuit board assemblies passing through the reflow soldering oven 10.

Figure 4:
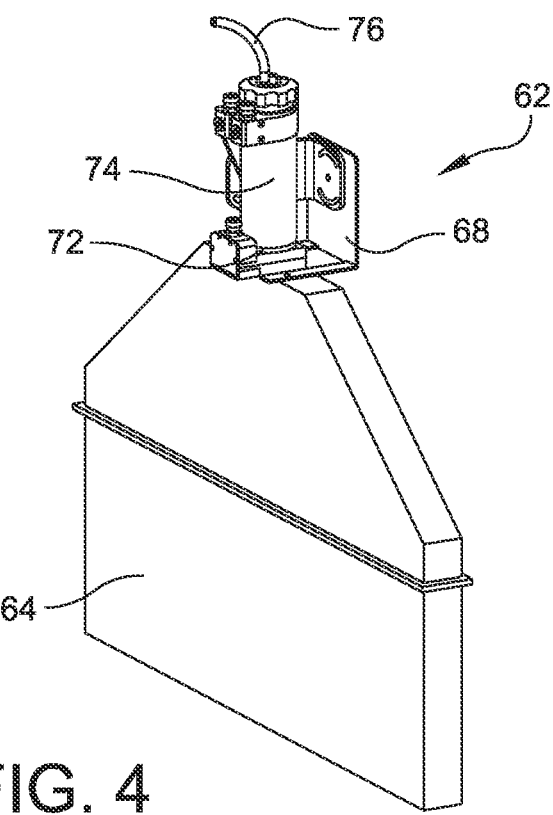
FIG. 4 is a perspective view of an IR camera assembly of the heat detection system shown in FIG. 3.
Figure 5:
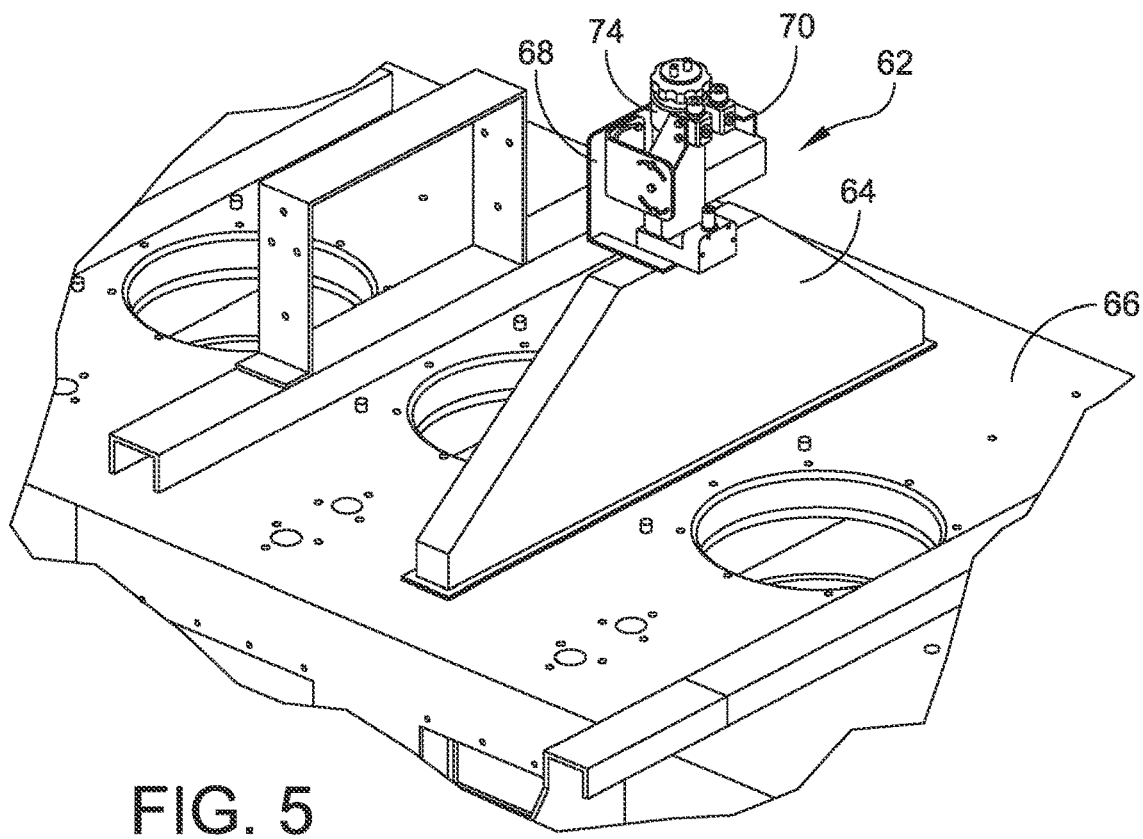
FIG. 5 is a perspective view of the IR camera assembly mounted on a top wall of a tunnel of the reflow soldering oven.

Referring additionally to FIGS. 4 and 5, for the reflow soldering oven application, each IR camera assembly 62 includes a shroud 64 that is mounted on a top wall 66 of the chamber 12 of the reflow soldering oven 10. The shroud 64 is configured to extend through an opening formed in the top wall 66 of the chamber 12 to enable a temperature of the tunnel to be sensed by the IR camera assembly 62. The support structure further includes a support bracket 68 mounted on the shroud 64 on top of the shroud. The support bracket 68 includes a port 70 to connect to a source of nitrogen ($N_2$) to provide an inert atmosphere within the shroud 64. The support bracket 68 further includes an input port 72 to connect a sensor to the support bracket.

The IR camera assembly 62 further includes a temperature sensor embodying an IR camera 74, which is supported in an operating position by the support bracket 68. A cable 76 is secured to the input port 72 to connect the IR camera 74 to the controller 50. As mentioned above, any type of temperature sensor can be employed to measure temperatures of circuit board assemblies traveling within the tunnel (chamber 12) of the reflow soldering oven 10. The IR camera 74 is configured to have a field of view that is directed through the shroud 64 to the tunnel (chamber 12) of the reflow soldering oven 10. The arrangement is such that the IR camera 74 of the IR camera assembly 62 is configured to detect temperatures of circuit board assemblies travelling in the tunnel (chamber 12) of the reflow soldering oven 10 and communicating this information to the controller 50. The data obtained from the heat detection system 60 can be used for a variety of purposes, which will be described in greater detail below.

Figure 6:
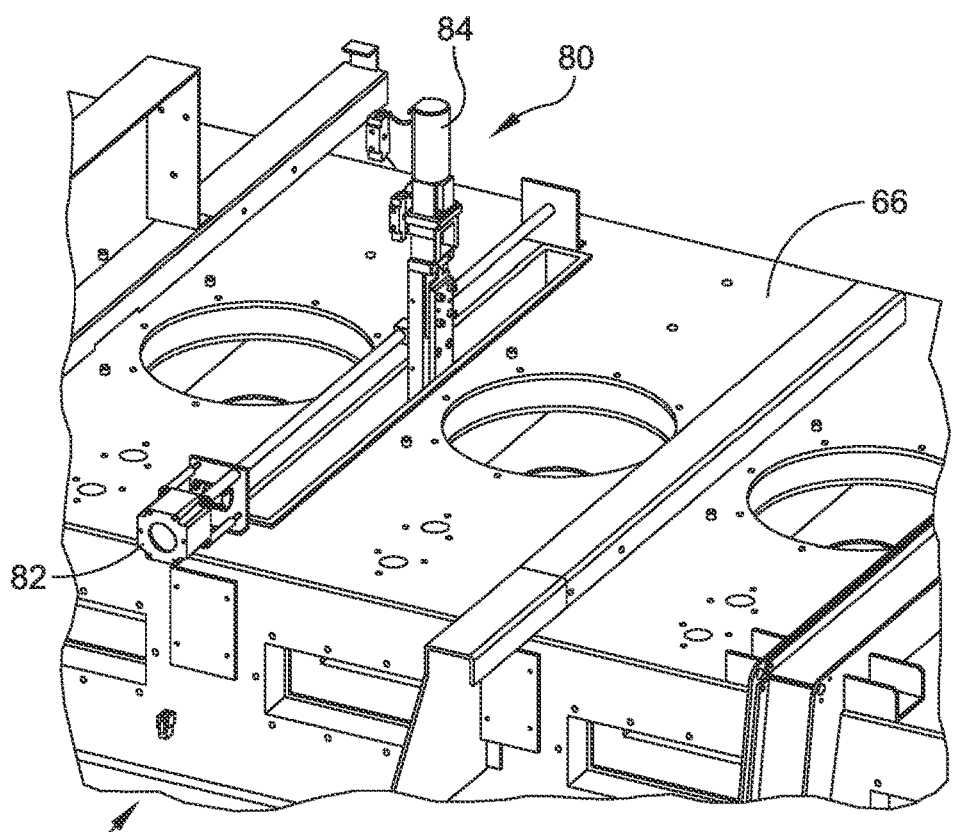
FIG. 6 is a perspective view of an IR camera mounted on a gantry of another embodiment of the heat detection system.

Referring to FIG. 6, an alternative embodiment of the sensor assembly is generally indicated at 80. As shown, the sensor assembly 80 includes a gantry 82 and a temperature sensor embodying an IR camera 84, which is connected to the gantry and the controller 50. The arrangement is such that the gantry 82 is configured to move the IR camera 84 under the control of the controller 50 along a width of the tunnel (chamber 12) to obtain temperature data across a width of the printed circuit board assembly as the printed circuit board assembly passes through the reflow soldering oven 10. The sensor assembly 80 further may include a shroud (not shown) to maintain the IR camera 84 in an inert (clean) atmosphere.

Wave Solder Machine

In a wave solder process, there are several process steps. There is a fluxing step in which the printed circuit board assembly is cleaned by spraying a flux on the solder side (bottom) of the printed circuit board assembly. After the flux is applied, the printed board assembly is transported to a preheat unit. The preheat unit can embody different concepts, such as convection or radiation heaters. The goal is to heat the printed circuit board assembly to a pre-defined temperature that is typically measured on the solder destination side (topside board). The flux is activated, by the preheaters and the circuit board assembly is warm so the solder will not solidify until it achieved the topside board. The printed circuit board assembly enters the wave of solder. The soldering process consists of a heated tank of solder, which is maintained at a required temperature for the soldering process. Within the tank, a wave of solder is set up and the printed circuit boards assembly passes over the solder wave so that the underside of the circuit board assembly contacts the solder wave.

The temperature of the circuit board assembly during preheating is typically measured with a pyrometer. This is usually done after the circuit board assembly passes through the last preheat unit, just before entering the solder wave station. However, the spot of a pyrometer is limited so the data is covers only one small area of the total board.

Embodiments of the heat detection system having an IR camera is capable of scanning the entire printed circuit board assembly to obtain temperature data from the printed circuit board assembly.

Embodiments of the heat detection system includes an IR camera with the wave solder machine after the last preheat unit. The data provided by the IR camera can be used for closed loop process control. When the IR camera is installed above the printed circuit board assembly in the preheat unit, the IR camera can provide information to modify the pre-heaters of the unit in such way that a specified temperature is achieved for the following boards before entering the wave soldering station. As a result, the printed circuit board assembly can achieve an optimal temperature when the printed circuit board assembly is soldered, which will minimize the risk for defects. The data will be recorded and in combination with board identification (like barcode or RFID) the data can be used for traceability which can be correlated to defects during assembly or field failures.

Figure 7:
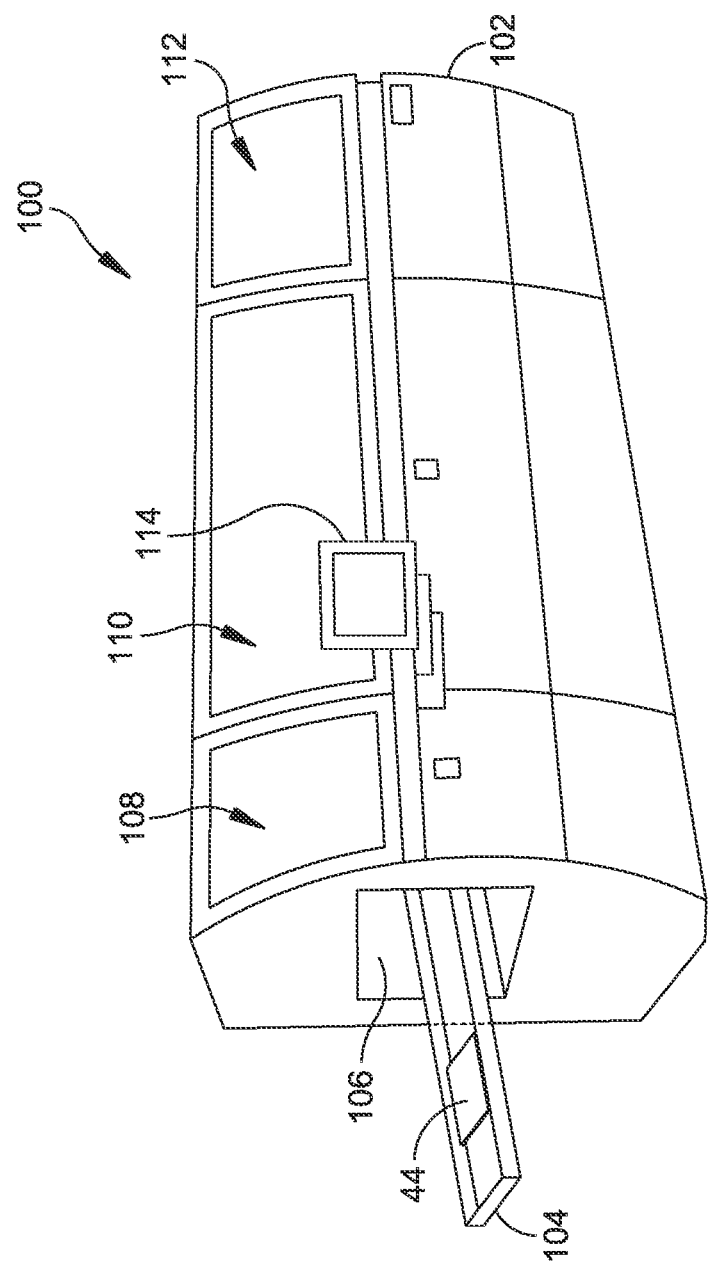
FIG. 7 is a schematic view of a wave solder machine of an embodiment of the disclosure.

Referring to FIG. 7, an exemplary wave solder machine, generally indicated at 100, is used to perform a wave solder application on a printed circuit board assembly. As mentioned above, the wave solder machine 100 is one of several machines in a printed circuit board fabrication/assembly line. As shown, the wave solder machine 100 includes a housing or frame 102 adapted to house the components of the machine. The arrangement is such that a conveyor 104 delivers printed circuit board assemblies 44 to be processed by the wave solder machine 100.

Upon entering the wave solder machine 100, each circuit board assembly 44 travels along an inclined path (e.g., six degrees with respect to horizontal) along the conveyor 104 through a tunnel 106, which includes a fluxing station, generally indicated at 108, and a pre-heating station, generally indicated at 110, to condition the printed circuit board assembly for wave soldering. Once conditioned (i.e., heated), the circuit board assembly 44 travels along the conveyor 104 to a wave soldering station, generally indicated at 112, to apply solder material to the printed circuit board assembly. A controller 114 is provided to automate the operation of the several stations of the wave solder machine 100, including but not limited to the fluxing station 108, the pre-heating station 110, and the wave soldering station 112, in the well-known manner.

As with the controller 50 associated with the reflow soldering oven 10, the controller 114 for the wave solder machine 100 may be configured to use a personal computer having a suitable operating system, such as a Microsoft Windows® operating system provided by Microsoft Corporation, with application specific software to control the operation of the wave solder machine. The controller 114 may be networked with a master controller that is used to control a production line for fabricating circuit boards. Similar to reflow soldering oven 10, the information obtained by the heat detection system can be used by the controller 114 to optimize the performance of the wave solder machine 100. This optimization would include an elimination of warpage and the better and more reliable securement of electronic components on the circuit board assembly.

Figure 8:
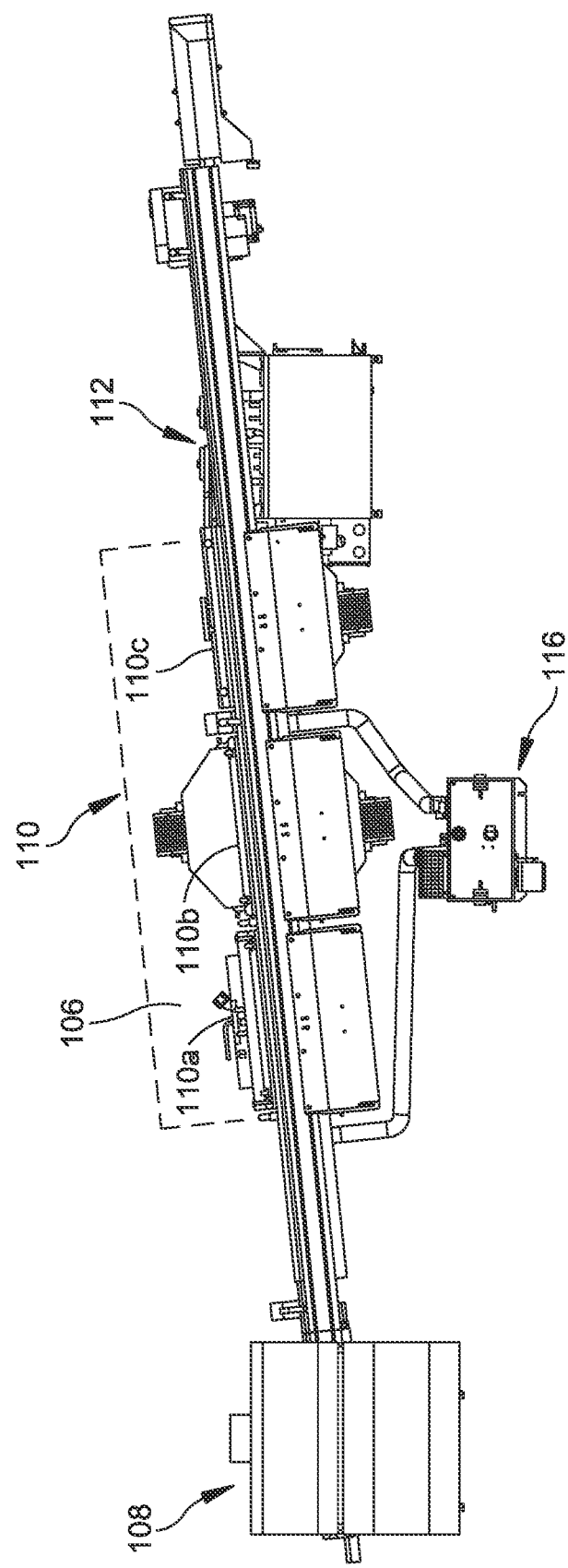
FIG. 8 is a side elevational view of the wave solder machine with external packaging removed to reveal internal components of the wave solder machine.

Referring to FIG. 8, the fluxing station 108 is configured to apply flux to the printed circuit board assembly as it travels on the conveyor 104 through the wave solder machine 100. The pre-heating station 110 includes several pre-heaters (e.g., pre-heaters 110a, 110b, 110c), which are designed to incrementally increase the temperature of the printed circuit board assembly as it travels along the conveyor 104 through the tunnel 106 to prepare the printed circuit board assembly for the wave soldering process. The wave soldering station 112 includes a wave solder nozzle assembly in fluid communication with a reservoir of solder material. A pump is provided within the reservoir to deliver molten solder material to the wave solder nozzle assembly from the reservoir. Once soldered, the printed circuit board assembly exits the wave solder machine 100 via the conveyor 104 to another station provided in the fabrication line, e.g., a pick-and-place machine.

Figure 2:
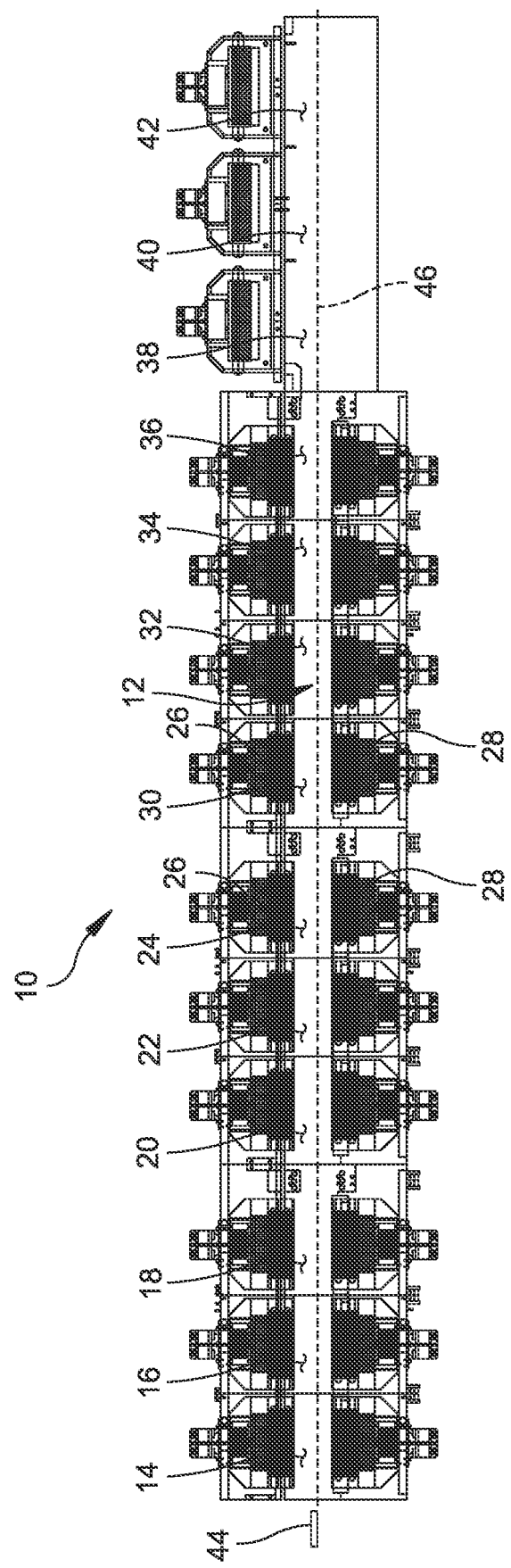
FIG. 2 is a schematic view of the reflow soldering oven shown in FIG. 1.

In some embodiments, the wave solder machine 100 further may include a flux management system, generally indicated at 116, to remove volatile contaminants from the tunnel 106 of the wave solder machine. As shown in FIG. 2, the flux management system 116 is positioned below the pre-heating station 110. In one embodiment, the flux management system 116 is supported by the housing 102 within the wave solder machine 100, and is in fluid communication with the tunnel 106, which is schematically illustrated in FIG. 2. The flux management system 116 is configured to receive contaminated gas from the tunnel 106, treat the gas, and return clean gas back to the tunnel. The flux management system 116 is particularly configured to remove volatile contaminants from the gas, especially in inert atmospheres.

Figure 9:
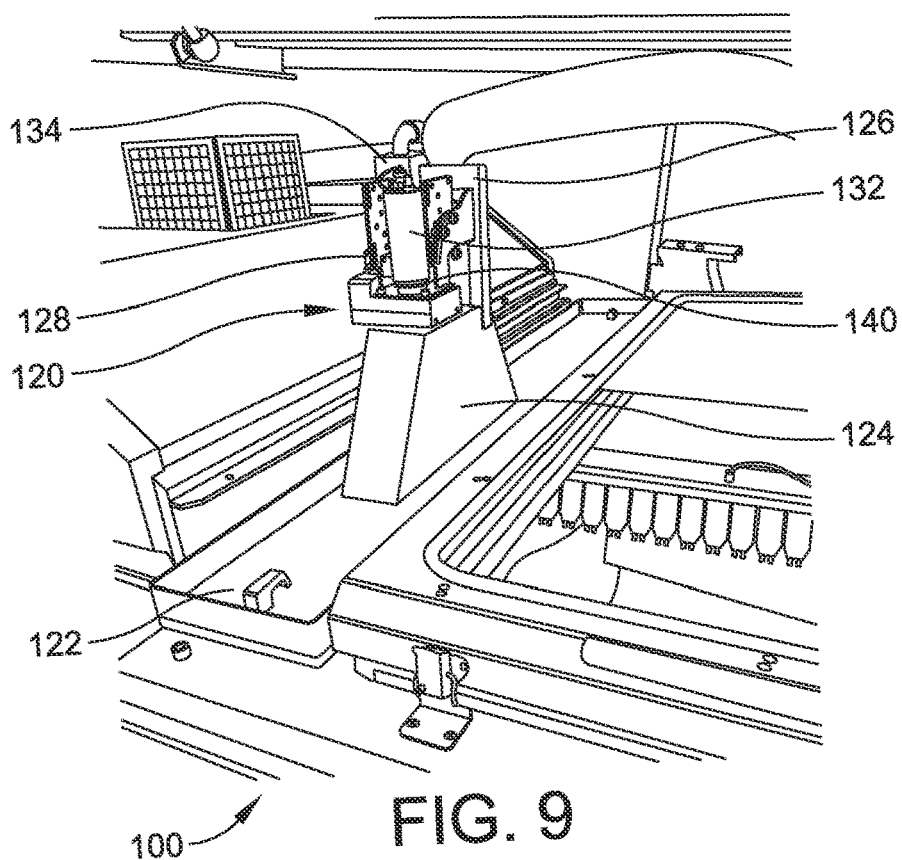
FIG. 9 is a perspective view of an IR camera assembly of the heat detection system associated with the wave solder machine.
Figure 10:
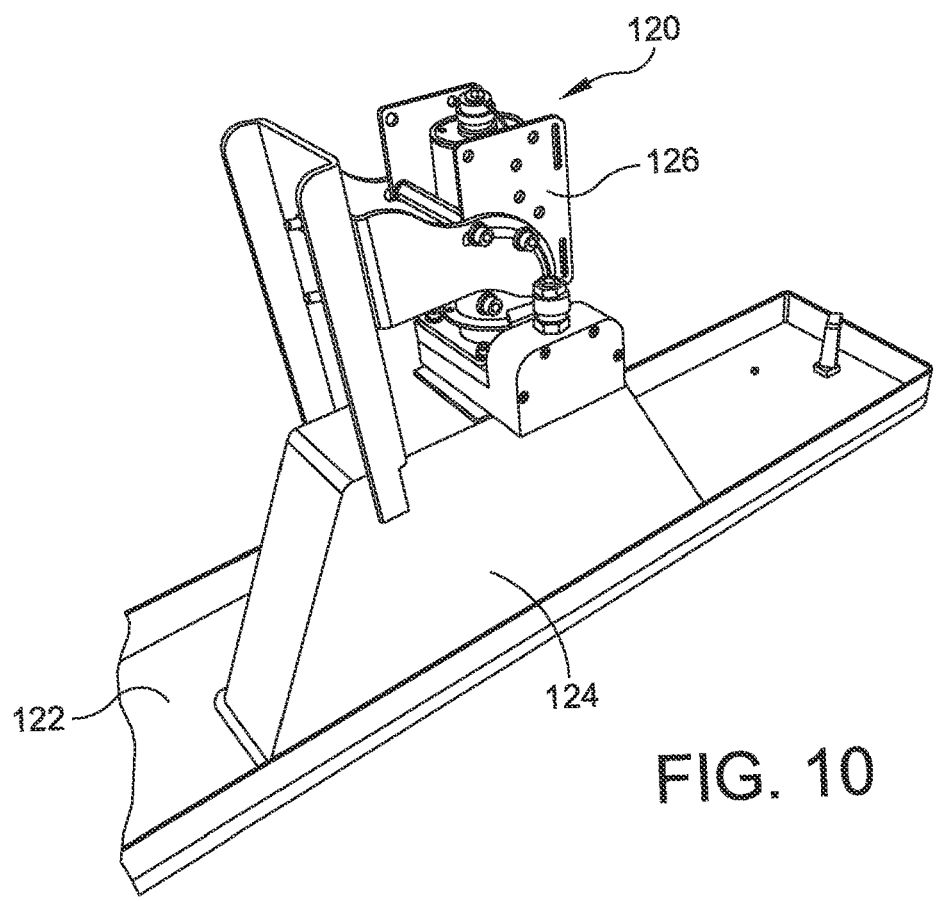
FIG. 10 is perspective view of the IR camera assembly shown in FIG. 9.

Referring to FIGS. 9 and 10, the wave solder machine 100 includes a heat detection system that is configured to detect heat within the zones of the machine, such as between the preheating station 110 and the wave soldering station 112. The heat detection system includes a sensor assembly embodying an IR camera assembly, generally indicated at 120, which is strategically deployed to measure the temperature of a circuit board assembly 44 as it passes between zones to ensure that the circuit board assembly is properly conditioned prior to processing. The information obtained from the IR camera assembly 120 is communicated to the controller 114, which is configured to provide closed loop processing of subsequent circuit board assemblies passing through the wave solder machine 100.

For the wave solder machine application, the IR camera assembly 120 includes a support structure having a mounting plate 122 that is positioned on a top of the tunnel 106 of the wave solder machine 100 and a shroud 124 that is mounted on the mounting plate. The shroud 124 is configured to surround an opening within the mounting plate 122 to enable a temperature of the tunnel 106 to be sensed by the IR camera assembly. The support structure further includes a support bracket 126 mounted on the shroud 124 on top of the shroud. The support bracket 126 includes a port 128 to connect to a source of nitrogen ($N_2$) to provide an inert atmosphere within the shroud. The support bracket 126 further includes an input port 130 to connect a sensor to the support bracket.

The IR camera assembly 120 further includes an IR camera 132 supported in an operating position by the support bracket 126. A cable 134 is secured to the input port 130 to connect the IR camera 132 to the controller 114. As mentioned above, any type of temperature sensor can be employed to measure temperatures of circuit board assemblies within the tunnel 106 of the wave solder machine 100. The IR camera 132 is configured to have a field of view that is directed through the shroud 124 to the tunnel 106 of the wave solder machine 100. The arrangement is such that the IR camera 132 of the IR camera assembly 120 is configured to detect temperatures of circuit board assemblies within the tunnel 106 of the wave solder machine 100 and communicating this information to the controller 114.

Selective Solder Machine

In a selective solder process, there are several process steps. Firstly, there is a fluxing station in which the printed circuit board assembly is cleaned by spraying a flux on a solder side (bottom) of the printed circuit board assembly. After the flux is applied, the printed board assembly is transported to a preheat unit. The preheat unit can be configured to include different heating concepts, such as convection or radiation heaters. An objective of this process step is to heat the printed circuit board assembly to a pre-defined temperature that is typically measured on the solder destination side (top) of the printed circuit board assembly. The flux is activated, and the printed circuit board assembly is warm so the solder will not solidify until the selective solder process is performed. Prior to implementing the heat detection system of the present disclosure, the temperature of the printed circuit board assembly during preheating can be measured with a pyrometer, which produces very limited heat information about the printed circuit board assembly.

After preheating, the printed circuit board assembly is transported to the solder area where one of two solder processes can be performed. In one solder process, solder is applied with a small solder nozzle configured to perform a point-to-point solder process. In another solder processes, solder is applied by a multi-wave plate in which the solder joints are made with one dip.

Embodiments of the heat detection system may include an IR camera (2D or 3D) into the selective solder process. The data provided by this camera can be used for closed loop process control. When a camera is installed above the printed circuit board assembly in the preheat process, the temperature data obtained from the camera can provide information to modify the power of the unit in such way that a specified temperature is achieved when the selective solder machine is ready to transport the board to the soldering station. As a result, the printed circuit board assembly can achieve an optimal temperature when it is soldered, which will minimize the risk for defects. The data can be recorded and in combination with board identification, such as barcode or RFID, the data can be used for traceability that can be correlated to defects during assembly or field failures.

An IR scanner can also be implemented in the solder station. For a multi-wave dip process, a 2D or 3D camera can be configured to measure the temperature of the solder joints. Such a configuration can identify whether the solder is solidified (below melting point) before the printed circuit board assembly is moved to avoid stress in the solder joint. Also, this data can be used for process optimization as well as traceability purposes.

For point-to-point solder processes, an implementation of an IR scanner above the solder station can benefit to record the conditions of the printed circuit board assembly and verify that the temperatures are within a tolerance range of temperatures. This information can be used to reduce defects and have a better process control.

Other Aspects of the Heat Detection System

In some embodiments, the support bracket includes an IR camera glass to protect the IR camera. Referring to FIG. 9, a lens 140 is provided to protect the IR camera 132. Although shown with the IR camera assembly 120 of wave solder machine 100, it should be understood that the lens 140 or camera glass can be provided with the IR camera assembly 62 associated with the reflow soldering oven 10. Other types of materials to create a protective cover may also be provided. The IR camera glass is positioned so that pressurized air is moved across the IR camera glass to create an "air curtain" thereby preventing obstruction of the IR camera. In one embodiment, a moving film can be provided to protect the IR camera.

The lens 140 can be applied to the IR camera 74 associated with the reflow soldering oven 10.

In some embodiments, the shroud can be configured to be connected to another inert source of fluid.

In some embodiments, the shroud can be configured to a source of fluid that is temperature controlled to protect the IR camera.

In some embodiments, the support bracket can be configured to mount the IR camera at a desired height and a desired orientation to achieve a full field of view. In the shown configuration, the IR camera is mounted on the top of the tunnel of the reflow soldering oven. However, the IR camera can be mounted on the side of the tunnel of the reflow soldering oven. With side mounting, mirrors can be employed to view the top and the bottom of the circuit boards passing through the tunnel.

In some embodiments, the IR camera can be mounted on a support structure that serves as a gantry to move the camera across the circuit board. The IR camera can be positioned inside or outside the tunnel of the reflow soldering oven.

In some embodiments, the IR camera assembly can include multiple IR cameras to measure two or more separate locations within a select position within the tunnel of the reflow soldering oven.

In some embodiments, a one-dimensional line-scan camera can be used to detect circuit board temperatures.

In some embodiments, a two-dimensional camera can be used to detect circuit board temperatures.

In some embodiments, an existing reflow soldering oven can be updated by way of retrofit kit, including the components of the heat detection system including multiple IR camera assemblies, e.g., the mounting plates, the shrouds, the support brackets, the nitrogen connections, the IR camera cables and the IR cameras. Software upgrades can be provided for the controller of the reflow soldering oven.

In some embodiments, the heat detection system is configured with the controller to provide a closed loop control of the zone temperatures using the IR camera assemblies or other temperature detection devices. Such closed loop control enables the operator to monitor circuit board temperatures and locate hot spots on circuit boards, both on the tops and bottoms of circuit boards.

In some embodiments, the controller is configured with executable software that enables the closed loop control of the various zones of the reflow soldering oven.

In some embodiments, the information obtained from the heat detection system is collected and analyzed for future actions.

In some embodiments, the IR camera assemblies of the heat detection system are configured to obtain temperature data at specific board level locations and in certain zones of the reflow soldering oven.

In some embodiments, the IR camera assemblies of the heat detection system are configured to provide data to the controller for process control of downstream parameters associated with the production line and/or to address equipment issues.

In some embodiments, the printed circuit boards have bar codes that are scanned by a bar code scanner, or other type of identification system, to keep track of data for each circuit board.

In some embodiments, the IR camera assemblies of the heat detection system is configured to obtain temperature data used by the controller to provide closed loop localized heating to board zones where need. Real-time zone-to-zone temperature adjustments can be made, with the object of circuit board temperature uniformity or a desired temperature profile.

In some embodiments, the closed loop processing of the circuit boards can include controlling the conveyor to control conveyor speed in one or more zones to optimize heat transfer. Fan blower speeds can also be controlled. In one embodiment, the conveyor can include multiple sections that correspond to the multiple zones, with each conveyor section being controlled by the controller to control the speed of the conveyor section and thus the temperature applied to the circuit board. Localized heating of the circuit board is achieved by this construction.

In some embodiments, the data obtained from the heat detection system can be used for a variety of purposes. For example, data can be communicated to the customer. Data can be used to provide circuit board traceability in which data on a particular circuit board is correlated to the customer. Data can be used to find hot spot zones/levels within the reflow soldering oven. Data can be used to optimize the performance of the reflow soldering oven. Data can be used to provide downstream input of processing equipment. Data can be used to determine start and end times of scanning performed by the IR camera assemblies on circuit boards. Data can be used to generate circuit board profiles above and below the circuit boards to determine certain board zones or levels. Data can be used by the customer for other analytics and stored on a customer server/network or on the cloud.

In some embodiments, the controller can be configured to achieve a scan mode to measure the temperature of all board components as the boards travel on the conveyor through the reflow soldering oven.

In some embodiments, the heat detection system is configured to perform thermal imaging during Moire analysis (strain/stress analysis) to correlate between temperature hot spots and warpage responses.

In some embodiments, the heat detection system is configured to find hot and cold spots during reflow soldering, wave soldering, SRT rework, and selective soldering.

In some embodiments, the heat detection system can be used to provide analytics to improve board design and functionality.

In some embodiments, the heat detection system can be used to lower voids in the reflow process.

In some embodiments, the heat detection system achieves enhanced temperature control to reduce defects.

In some embodiments, the heat detection system incorporates integrated closed loop control of zone temperatures of the reflow soldering oven by employing multiple infrared (IR) camera assemblies at strategic locations to reduce warpage, identify hotspots, determine component overheating, obtain profile validation and reduce voids.

In some embodiments, the heat detection system is configured to include auto-sensing equipment having settings that are self-adjusted based on ambient conditions and the product being made, thereby increasing visibility, productivity, traceability and response times while lowering costs.

In some embodiments, the heat detection system enables visibility and prescriptive real-time analytics with proactive actionable intelligence across the supply chain.

In some embodiments, the heat detection system increases flexibility by managing complexity within a closed loop system.

In some embodiments, connectivity is improved by the open architecture for developing standard or custom interfaces and data outputs. Architecture is configured to support several MEMS.

In some embodiments, automation is improved by providing automated changeover and consumables replenishment to reduce operator errors and headcount.

In some embodiments, the heat detection system is configured to achieve self-optimization by reducing operator intervention on machine parameters and providing closed loop control to drive higher yields.

In some embodiments, maintenance is improved by applying predictive maintenance items based on actual needs of the reflow soldering oven or the wave solder machine. Also, the improved maintenance replaces or reduces planned time based on maintenance.

In some embodiments, the controller associated with the reflow soldering oven or the wave solder machine includes a controller that is adapted to control the operation of the oven or machine based on operational parameters obtained by the controller. The controller can be configured to communicate with a controller associated with a production line. In one embodiment, the controller can be configured to communicate with another controller, e.g., a controller associated with the production line, over a controller area network (CAN) Bus or other type of network. In other embodiments, a master controller may be provided to control the operation of the controllers of the individual pieces of equipment associated with the production line. The controller may include a display, which is operably coupled to the controller. The display is adapted to display the operational parameters of the reflow soldering oven or the wave solder machine, such as, but not limited to, temperature data through zones of the oven or machine or data associated with solder levels of the machine. Suitable sensors may be provided to acquire such information. Alternatively, or in addition to the foregoing embodiment, the operational parameters may be displayed on the display provided within the reflow soldering oven, the display provided within the wave solder machine, and/or a display associated with the production line.

In other embodiments, material identification for items, such as circuit boards, traveling through the reflow soldering oven or the wave solder machine, can include a device to manipulate the item and a scanner to scan and identify the item. For example, the reflow soldering oven or the wave solder machine can be configured to include a pinch wheel to rotate the circuit board to align a code or predetermined identification mark provided on the circuit board with scanner provided on the oven or machine. The system is configured to tie material identification associated with the circuit board to a recipe, production time, etc., for the reflow soldering oven or the wave solder machine. In one embodiment, a barcode to identify the items can be implemented. For example, the barcode can include a 1D scanner for UPC codes, a 2D scanner for QRC codes, a printed label applied on the item or a laser etched label etched on the item. In another embodiment, an RFID system to identify the items can be implemented. For example, the RFID system can include an RFID tag applied to the item and an RFID reader associated with the reflow soldering oven or the wave solder machine. With an RFID system, line-of-site between the reader and the item is not required. Moreover, scanning is not required to identify all items within the movable cart. In another embodiment, an imaging or vision system to identify the items can be implemented.

In some embodiments, a database is provided to keep track of items processed through the reflow soldering oven or the wave solder machine. In one embodiment, the database may include an open application (App) architecture and be configured to push data to the reflow soldering oven or the wave solder machine. The oven or machine can be configured to communication with the oven or machine to push/pull data to the oven or machine and/or the production line or configured to communicate with the production line directly. The database can include job information or material information. The database further can communicate with a manufacturing execution system (MES) associated with the production line, the reflow soldering oven and/or the wave solder machine. The MES system can be configured to know which materials are required for a production run. The movable cart can be configured to communicate with the MES system to adjust delivery of items to the reflow soldering oven or the wave solder machine.

The database further can be configured to retrieve information about items based on identification, e.g., a barcode number. In one embodiment, a central management system can be provided in which the reflow soldering oven or the wave soldering machine is programmed to accept material coming from movable cart. The reflow soldering oven or the wave solder machine is programmed to update the database to process circuit boards through the oven or machine from a network, which is tied back to the MES system.

The database further can be configured to store additional information, such as temperature data, numbers of circuit boards processed, and/or consumption of materials associated with the reflow soldering oven or the wave solder machine. The database can be configured to store information locally or remotely, and can be configured to store data associated with one or more production runs.

The database can be configured to share prediction data when new production runs are contemplated or programmed. For example, with respect to storing information related to temperature processing efficiency, the database can be configured to perform one or more of the following: store information on temperature zone data, numbers and types of circuit boards processed, when paste consumable items need replenishment; trigger an alarm and/or a report; signal to an inventory control system associated with the reflow soldering oven, the wave solder machine and/or the production line; perform analytics on consumable usage based on operating parameters and actual use and upstream/downstream equipment activity; predict changeout or maintenance; and correlate over multiple sites to predict future production run parameters.

The database can be configured to store data associated with lot traceability. In addition, RFID or mechanical keying of a circuit board is provided to ensure correct alignment/orientation/direction/front-back/top-bottom when these items are inserted into the reflow soldering oven or the wave soldering machine for processing. A low-cost reader can perform this function.

Controller Feedback

Figure 11:
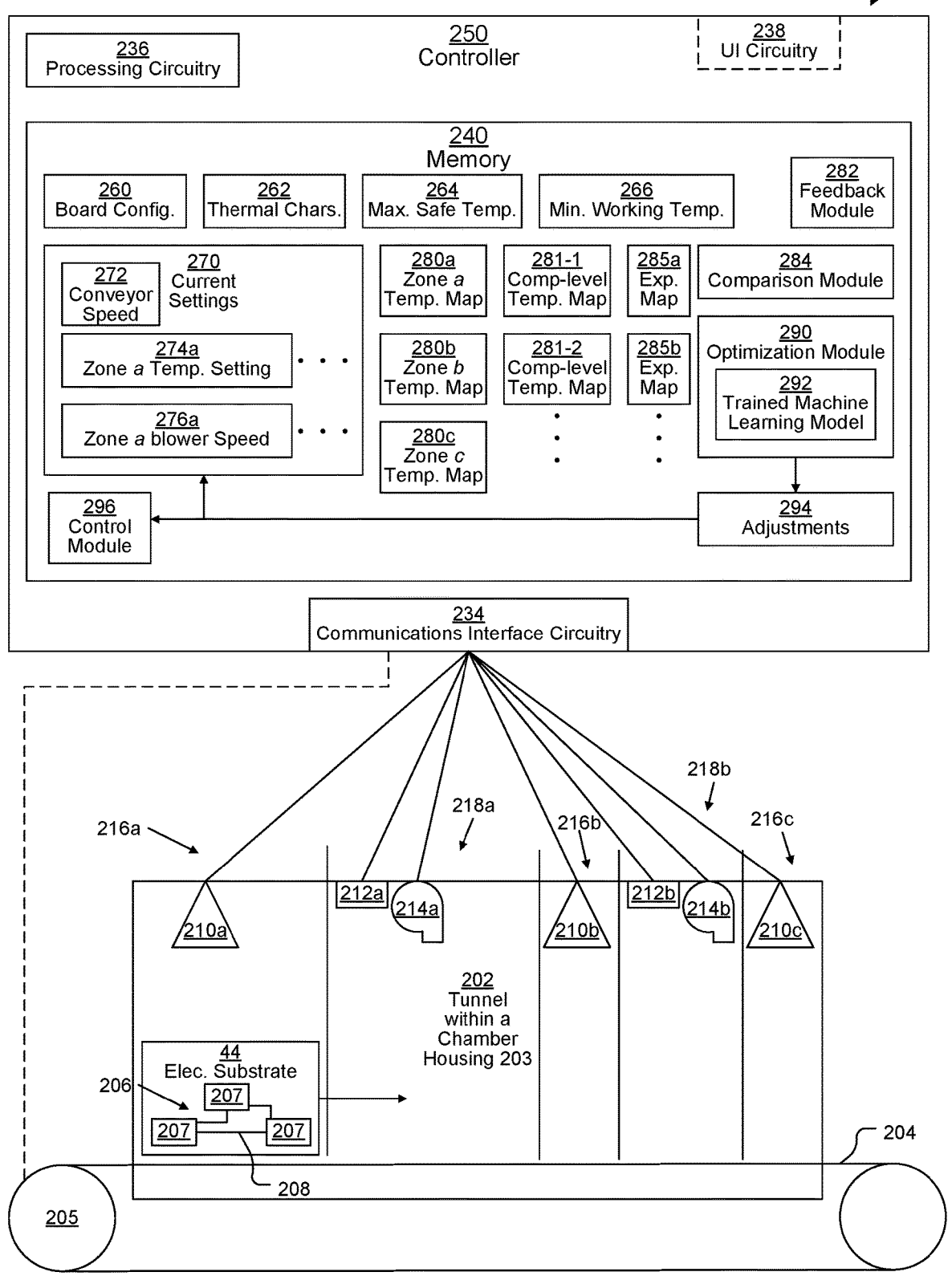
FIG. 11 is a block diagram depicting a system, apparatus, computer program product, and associated data structures according to various embodiments of the present disclosure.

FIG. 11 depicts an example system 200 according to various embodiments. System 200 includes a tunnel 202 within a chamber housing 203 having a conveyor 204 and a plurality of temperature sensors 210 (depicted as temperature sensors 210a, 210b, 210c), heaters 212 (depicted as heaters 212a, 212b), and blowers 214 (depicted as blowers 214a, 214b). System 200 also includes a controller 250. It should be understood that the term "blower" may include any kind of device configured to move air, including a fan.

In some embodiments, system 200 may be a single apparatus included within a single housing. In other embodiments, controller 250 may be housed separately from the chamber housing 203.

In some embodiments, the chamber housing 203 may be part of a reflow oven 10. In other embodiments, the chamber housing 203 may be part of a wave solder machine housing 102. In yet other embodiments, the chamber housing 203 may be part of a selective solder machine housing.

An electronic substrate or circuit board assembly 44 passes through the tunnel 202 along a conveyor 204 (e.g., conveyor 46, 104) driven by a motor (or other drive mechanism) 205 through temperature detection zones 216 (depicted as temperature detection zones 216a, 216b, 216c) and processing zones 218 (depicted as processing zones 218a, 218b).

Circuit board assembly 44 includes a plurality of electronic components 206 mounted on an underlying circuit board. Electronic components 206 may include, for example, integrated circuit chips 207, solder 208, and other components such as traces (not depicted) as well as the underlying substrate itself. It should be understood that although only one circuit board assembly 44 is depicted as passing through tunnel 202, multiple circuit board assemblies 44 may pass through the tunnel 202 at a time. In some embodiments, several circuit board assemblies 44 may pass through side-by-side as well as front-to-back.

In some embodiments, processing zones 218 may include, for example, one or more pre-heat zones 14, 16, 18, soak zones 20, 22, 24, spike zones 30, 32, 34, 36, and cooling zones 38, 40, 42 as described above with reference to reflow soldering oven 10. Each processing zone 218 may include one or more of a heater 212 (e.g., a top heater 26 or bottom heater 28) and blower 214 and any other processing component, depending on the purpose of that processing zone 218.

Each temperature detection zone 216 includes one or more temperature sensor 210 (e.g., an IR camera assembly 62). A temperature sensor 210N may be configured to detect temperatures of the various different components of the circuit board assemblies 44 that pass through its corresponding temperature detection zone 216N.

Although temperature detection zones 216 and processing zones 218 are depicted separately, in some embodiments, a temperature detection zone 216 may be combined with a processing zone 218. Although only three temperature detection zones 216 and two processing zones 218 are depicted, there may be any number of temperature detection zones 216 and processing zones 218, preferably at least two of each. Although temperature detection zones 216 and processing zones 218 are depicted as alternating, there may be multiple different processing zones 218 that intervene between successive temperature detection zones 216.

Controller 250 (e.g., controller 50, 114) is configured to control the heaters 212 and/or blowers 214 (and any other processing components) of processing zones 218 and receive feedback from the temperature sensors 210 of temperature detection zones 216. In some embodiments, controller 250 may also control the drive speed of conveyor 204.

Controller 250 may be any kind of computing device, such as, for example, a personal computer, laptop, workstation, server, enterprise server, tablet, smartphone, integrated system, etc. Controller 250 includes processing circuitry 236, communications interface circuitry 234, and memory 240. In some embodiments, controller 250 may also include user interface (UI) circuitry 238 for connecting to a UI input device (not depicted) and a display device (not depicted). Controller 250 may also include various additional features as is well-known in the art, such as, for example, interconnection buses, etc.

Processing circuitry 236 may include any kind of processor or set of processors configured to perform operations, such as, for example, a microprocessor, a multi-core microprocessor, a digital signal processor, a system on a chip (SoC), a collection of electronic circuits, a similar kind of controller, or any combination of the above.

Communications interface circuitry 234 may include one or more networking devices (e.g., Ethernet cards, cellular modems, Fibre Channel (FC) adapters, InfiniBand adapters, wireless networking adapters, etc.) and/or local bus ports (e.g., USB, Firewire, serial bus, parallel bus, etc.) for connecting to heaters 212, blowers 214, temperature sensors 210, and/or other controllable devices of the chamber housing 203, such as, for example, a conveyor motor 205.

UI circuitry 238 may include any circuitry needed to communicate with and connect to one or more user input devices and display screens. UI circuitry 238 may include, for example, a keyboard controller, a mouse controller, a touch controller, a serial bus port and controller, a universal serial bus (USB) port and controller, a wireless controller and antenna (e.g., Bluetooth), a graphics adapter and port, etc.

Memory 240 may include any kind of digital system memory, such as, for example, random access memory (RAM). Memory 240 stores an operating system (OS) (not depicted, e.g., a Linux, UNIX, Windows, MacOS, or similar operating system) and various drivers and other applications and software modules configured to execute on processing circuitry 236.

Memory 240 stores a set of modules 282, 284, 290, 296, which are configured to execute on processing circuitry 236.

Feedback module 282 is configured to receive temperature readings such as temperature maps 280 (depicted as zone temperature maps 280a, 280b, 280c) from temperature sensors 210 as one or more circuit board assemblies 44 passes through tunnel 202 along conveyor 204. In an embodiment, zone a temperature map 280a is a 2-dimensional (or 3-dimensional) map of temperatures within temperature detection zone 216a as recorded by an IR camera assembly 62 of temperature sensor 210a, while zone b temperature map 280b is a 2-dimensional (or 3-dimensional) map of temperatures within temperature detection zone 216b as recorded by an IR camera assembly 62 of temperature sensor 210b, and zone c temperature map 280c is a 2-dimensional (or 3-dimensional) map of temperatures within temperature detection zone 216c as recorded by an IR camera assembly 62 of temperature sensor 210c.

In some embodiments, feedback module 282 may also be configured to translate each zone temperature map 280X into one or more component-level temperature maps 281 (depicted as component-level temperature maps 281-1, 281-2, . . . ) that includes a temperature of every electronic component 206 on a particular circuit board assembly 44 passing through zone X. In some embodiments, component-level temperature maps 281 may record both a lowest and a highest temperature measured for each component 206. The component-level temperature maps 281 may be created with reference to a board configuration 260 input by a user via UI circuitry 238. Board configuration 260 may include the dimensions of the design of the particular circuit board assembly 44 as well as a location, size, and shape of each component 206 of the design of the particular circuit board assembly 44.

Comparison module 284 is configured to compare the component-level temperature maps 281 to one or more expected component-level temperature maps 285 (depicted as expected maps 285a, 285b, . . . ). An expected component-level temperature map 285X defines an expected temperature range for each component 206 of a design of a particular circuit board assembly 44 at a particular temperature detection zone 216X.

Optimization module 290 is configured to generate a set of adjustments 294 to be made to a set of current settings 270 based on the differences detected by the comparison module 284. Current settings 270 may include, for example, a conveyor speed 272 as well as a temperature setting 274 and a blower speed 276 for each processing zone 218 (depicted as temperature setting 274a and blower speed 276a for processing zone 218a). Adjustments 294 are communicated by control module 296 to the various devices such as heaters 212, blowers 214, and the conveyor motor 205 for adjustment. Adjustments 294 are also used to update the current settings 270.

In some embodiments, optimization module 290 includes a trained machine learning model (MLM) 292. Trained MLM 292 may be any kind of machine learning model, such as a neural network (e.g., ResNet50, EfficientNet B7, EfficientNet, MobileNetV3, etc.), Bayesian network, support-vector machine, decision tree, random forest, regression model, etc. Trained MLM 292 may include as many input nodes (not depicted) as there are current settings 270 plus 2-dimensional or 3-dimensional input nodes for temperature maps 280 or 281 or a map (not depicted) of the variances calculated by the comparison module 284. Trained MLM 292 may also include as many output nodes (not depicted) as there are current settings 270 that are adjustable. In embodiments in which trained MLM 292 is a neural network or a Bayesian network, it may also include one or more hidden layers having a plurality of hidden nodes (not depicted). In example embodiments, there may be between 10 and 1 billion hidden nodes.

In some embodiments, Trained MLM 292 may initially be trained by running one or more circuit board assemblies 44 through the tunnel 202 using supervised learning. Before such runs, the board configurations 260 for those circuit board assemblies 44 may also be input into training nodes of Trained MLM 292. In some embodiments, thermal characteristics 262 for each type of component 206 may also be entered. Thermal characteristics 262 for a particular type of component 206N may include the thermal conductivity, density, specific heat, and thermal diffusivity of that particular type of component 206N, for example. In some embodiments, a maximum safe temperature 264 (e.g., a temperature at which a board will warp; a temperature at which a chip will fry, etc.) and a minimum working temperature 266 for each type of component 206N may also be entered. A "working temperature" for a particular component 206N is defined to be the maximum temperature reached by that component 206N over the course of a run through the tunnel 202. An example minimum working temperature 266 is the melting point of solder (or the temperature at which the solder is guaranteed to melt enough to reliably bond).

Memory 240 may also store various other data structures used by the OS, modules 282, 284, 290, 296, Trained MLM 292, and various other applications and drivers. In some embodiments, memory 240 may also include a persistent storage portion. Persistent storage portion of memory 240 may be made up of one or more persistent storage devices, such as, for example, magnetic disks, flash drives, solid-state storage drives, or other types of storage drives. Persistent storage portion of memory 240 is configured to store programs and data even while the controller 250 powered off. The OS, modules 282, 284, 290, 296, Trained MLM 292, and various other applications and drivers are typically stored in this persistent storage portion of memory 240 so that they may be loaded into a system portion of memory 240 upon a system restart or as needed. The OS, modules 282, 284, 290, 296, Trained MLM 292, and various other applications and drivers, when stored in non-transitory form either in the volatile or persistent portion of memory 240, each form a computer program product. The processing circuitry 236 running one or more applications thus forms a specialized circuit constructed and arranged to carry out the various processes described herein.

Figure 12:
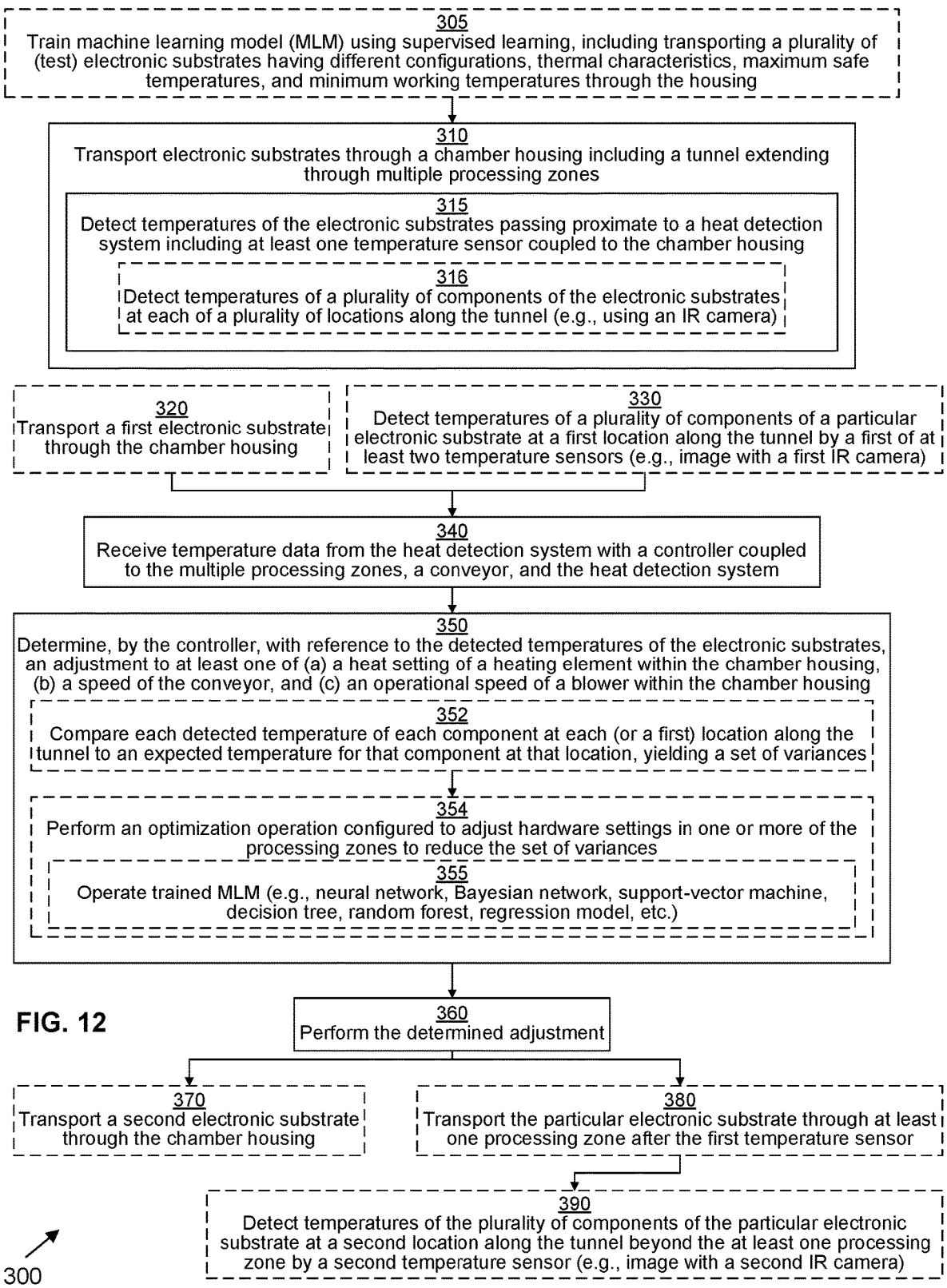
FIG. 12 is a flowchart depicting a method according to various embodiments of the present disclosure.

FIG. 12 illustrates an example method 300 performed by a system 200 for joining electronic components to an electronic substrate in an apparatus such as a reflow soldering oven 10, a wave solder machine 100, or a selective solder machine. It should be understood that any time a piece of software (e.g., OS, modules 282, 284, 290, 296, Trained MLM 292, etc.) is described as performing a method, process, step, or function, what is meant is that a computing device (e.g., controller 250) on which that piece of software is running performs the method, process, step, or function when executing that piece of software on its processing circuitry 236. It should be understood that one or more of the steps or sub-steps of method 300 may be omitted in some embodiments. Similarly, in some embodiments, one or more steps or sub-steps may be combined together or performed in a different order. Dashed lines indicate that a step or sub-step is either optional or representative of alternate embodiments or use cases.

In some embodiments, Trained MLM 292 may initially be trained using supervised learning in step 305. In step 305, a plurality of circuit board assemblies 44 having different board configurations 260, thermal characteristics 262, maximum safe temperatures 264, and minimum working temperatures 266 are transported through the tunnel 202 of the chamber housing 203 in order to train the Trained MLM 292. Trained MLM 292 is configured to adjust the current settings 270 for each different type of circuit board assembly 44 until each component 206 of each different type of circuit board assembly 44 reliably reaches its minimum working temperature 266 (in some embodiments for at least a minimum amount of time) (if a minimum working temperature 266 is applicable to that component 206) during a run through the tunnel 202 without exceeding the maximum safe temperature 264 for that component 206 during that run. The thermal characteristics 262 may be used to aid in ascertaining how to adjust the current settings 270 from run to run. At the end of step 305, an initial set of current settings 270 for at least one particular circuit board assembly 44 design is output. In some embodiments, the Trained MLM 292 may be generalizable to use for any particular circuit board assembly 44 design given the board configuration 260, thermal characteristics 262, and maximum safe temperatures 264 and minimum working temperatures 266 for each component 206 as inputs. In other embodiments, a separate Trained MLM 292 may be generated in the training phase for each different circuit board assembly 44 design. In some embodiments, step 305 may be performed as an explicit training process using test workpieces. In some embodiments, step 305 may include previous runs of non-test circuit board assemblies 44, allowing machine learning to refine operation as more and more runs are performed.

In step 310, a plurality of circuit board assemblies 44 is transported through a chamber housing 203 including a tunnel 202 extending through multiple processing zones 218. In sub-step 315, the system 200 detects temperatures of the electronic substrates 44 passing proximate to a heat detection system including at least one temperature sensor 210 coupled to the chamber housing 203. In some embodiments, in sub-step 316, the system 200 detects temperatures of a plurality of components 206 of the electronic substrates 44 at each of a plurality of locations (e.g., at successive temperature detection zones 216) along the tunnel 202 (e.g., using an IR camera assembly 62 in each temperature detection zones 216). It should be understood that step 310 is a step of general operation, and thus it may operate in parallel or concurrently with the remaining steps.

The remainder of method 300 may be used in different embodiments. In one embodiment (hereinafter the "Run-by-Run embodiment" or "RBR embodiment"), associated with steps 320, 370, a first circuit board assembly 44-1 is run through the tunnel 202 using initial current settings 270, and after the adjustments 294 are determined and applied, a second circuit board assembly 44-2 of the same design is run through the tunnel 202 using updated current settings 270. In another embodiment (hereinafter the "Real-time embodiment"), associated with steps 330, 380, 390, as a particular circuit board assembly 44 is run through the tunnel 202, the current settings 270 are adjusted in real-time so that subsequent processing zones 218 can adjust their operation as needed.

In step 320 of the RBR embodiment, a first circuit board assembly 44-1 is transported through the chamber housing 203. It should be understood that although only a first circuit board assembly 44-1 is mentioned, there may be several first circuit board assemblies 44-1 that run through the tunnel 202 simultaneously. It should be understood that step 315 operates on the first circuit board assembly (or assemblies) 44-1 as it is transported through the chamber housing 203.

In step 330 of the Real-time embodiment, as a particular circuit board assembly 44 is transported through the chamber housing 203, a first of at least two temperature sensors (e.g., temperature sensor 210a) detects temperatures of a plurality of components 206 of that particular circuit board assembly 44 at a first location (e.g., within temperature detection zone 216a) along the tunnel 202 (e.g., by imaging the circuit board assembly 44 with a first IR camera assembly 62).

In step 340, feedback module 282 operating on controller 250 receives temperature data (e.g., one or more zone temperature maps 280) from the heat detection system, the controller 250 being coupled to the multiple processing zones 218, a conveyor motor 205, and the heat detection system (i.e., temperature sensors 210).

In the RBR embodiment, in step 340 the zone temperature maps 280 from all the temperature detection zones 216 are received in sequence as the first circuit board assembly 44-1 passes through each respective temperature detection zone 216.

In the Real-time embodiment, in step 340 one zone temperature map 280 from its respective temperature detection zone 216 is received as the particular circuit board assembly 44-1 passes through that temperature detection zone 216.

In step 350, the controller 250 determines, with reference to the detected temperatures (e.g., one zone temperature map 280 in the Real-time embodiment, all zone temperature maps 280 in the RBR embodiment) of the electronic substrate(s) 44, an adjustment 292 to at least one of (a) a heat setting of a heating element 212 within the chamber housing 203, (b) a speed of the conveyor 204, and (c) an operational speed of a blower 214 within the chamber housing 203.

Step 350 may include sub-steps 352, 354. In sub-step 352, comparison module 284 compares each detected temperature of each component 206 (e.g., with reference to one or more of the component-level temperature maps 281 generated from one or more of the zone temperature maps 280) at each (in the case of the RBR embodiment) or a first (in the case of the Real-time embodiment) location (e.g., temperature detection zone 216) along the tunnel 202. Then, in sub-step 354, optimization module 290 performs an optimization operation configured to adjust the current hardware settings 270 in one or more of the processing zones 218 to reduce the set of variances calculated by the comparison module 284. In the case of the RBR embodiment, the adjustments 292 may affect one or more of the processing zones 218. In the case of the Real-time embodiment, the adjustments 292 affect one or more processing zones 218 situated after the first location (e.g., processing zone 218a after the temperature detection zone 216a or processing zone 218b after the temperature detection zone 216b).

In some embodiments, sub-step 354 includes further sub-step 355 in which optimization module 290 operates the Trained MLM 292 on processing circuitry 236 to perform the optimization.

In some embodiments, if a temperature of a particular component 206 is higher than expected, optimization module 290 may determine the adjustment to be at least one of (1) reducing the heat setting of a heating element 212, (2) adjusting the speed of the conveyor 204, and (3) increasing the operational speed of a blower 214. In the case of the RBR embodiment, if the temperature of a particular component 206N of the first electronic substrate 44-1 has exceeded a maximum safe temperature 264N for that component 206N in temperature detection zone 216X, optimization module 290 may determine the adjustment to be at least one of (1) reducing the heat setting of a heating element 212 located in a processing zone 218 prior to the temperature detection zone 216X, (2) increasing the speed of the conveyor 204, and (3) increasing the operational speed of a blower 214 located in a processing zone 218 prior to the temperature detection zone 216X. In the case of the Real-time embodiment, if the temperature of a particular component 206N of the particular electronic substrate 44 has exceeded an expected temperature (e.g., from the expected temperature map 285X) for that component 206N in temperature detection zone 216X but has not yet exceeded the maximum safe temperature 264N for that component 206N, optimization module 290 may determine the adjustment to be at least one of (1) reducing the heat setting of a heating element 212 located in a processing zone 218 subsequent to the temperature detection zone 216X, (2) increasing or decreasing the speed of the conveyor 204, and (3) increasing the operational speed of a blower 214 located in a processing zone 218 subsequent to the temperature detection zone 216X.

In some embodiments, if a temperature of a particular component is lower than expected, optimization module 290 may determine the adjustment to be at least one of (1) increasing the heat setting of a heating element 212, (2) adjusting the speed of the conveyor 204, and (3) decreasing the operational speed of a blower 214. In the case of the RBR embodiment, if the temperature of a particular component 206N of the first electronic substrate 44-1 has not reached a minimum temperature for that solder component to reliably melt for that component 206N by the end of the tunnel 202, optimization module 290 may determine the adjustment to be at least one of (1) increasing the heat setting of a heating element 212 located in one or more processing zones 218, (2) decreasing the speed of the conveyor 204, and (3) decreasing the operational speed of a blower 214 located in one or more processing zones 218. In the case of the Real-time embodiment, if the temperature of a particular component 206N of the particular electronic substrate 44 is lower than expected (e.g., with reference to the expected temperature map 285X) for that component 206N in temperature detection zone 216X, optimization module 290 may determine the adjustment to be at least one of (1) increasing the heat setting of a heating element 212 located in a processing zone 218 subsequent to that temperature detection zone 216X, (2) increasing or decreasing the speed of the conveyor 204, and (3) decreasing the operational speed of a blower 214 located in a processing zone 218 subsequent to that temperature detection zone 216X.

After step 350, in step 360, controller 250 performs the determined adjustment(s) 294 by updating the current settings 270 and sending the adjustment(s) 294 to the appropriate devices 212, 214, 205 via control module 296 and communications interface circuitry 234.

In the case of the RBR embodiment, in step 370, a second circuit board assembly 44-2 is transported through the chamber housing 203, now using the updated current settings 270 after applying the adjustment(s) 292. It should be understood that although only a second circuit board assembly 44-2 is mentioned, there may be several second circuit board assemblies 44-2 that run through the tunnel 202 simultaneously. It should be understood that step 315 operates on the second circuit board assembly (or assemblies) 44-2 as it is transported through the chamber housing 203.

In the case of the Realtime embodiment, in step 380, the particular circuit board assembly 44 continues to be transported through at least one processing zone 218 of the chamber housing 203 subsequent to the first temperature sensor (e.g., processing zone 218a subsequent to temperature sensor 210a, processing zone 218b subsequent to temperature sensor 210b, etc.). Then, in step 390, system 200 detects temperatures of a plurality of components 206 of that particular circuit board assembly 44 at a second location after the processing zone 218 through which it ran in step 380 (e.g., within temperature detection zone 216b or 216c) along the tunnel 202 (e.g., by imaging the circuit board assembly 44 with a second IR camera assembly 62). Operation may then return back to step 340 as the particular circuit board assembly 44 continues to run through the tunnel 202. Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only. It should be understood that although various embodiments have been described as being methods, software embodying these methods is also included. Thus, one embodiment includes a tangible computer-readable medium (such as, for example, a hard disk, a floppy disk, an optical disk, computer memory, flash memory, etc.) programmed with instructions, which, when performed by a computer or a set of computers, cause one or more of the methods described in various embodiments to be performed. Another embodiment includes a computer which is programmed to perform one or more of the methods described in various embodiments.

Furthermore, it should be understood that all embodiments which have been described may be combined in all possible combinations with each other, except to the extent that such combinations have been explicitly excluded.

Finally, nothing in this Specification shall be construed as an admission of any sort. Even if a technique, method, apparatus, or other concept is specifically labeled as "background" or as "conventional," Applicant makes no admission that such technique, method, apparatus, or other concept is actually prior art under 35 U.S.C. § 102 or 103, such determination being a legal determination that depends upon many factors, not all of which are known to Applicant at this time.

What is claimed is:

1. A method, performed by an apparatus, of joining electronic components to electronic substrates within the apparatus, the method comprising:
  transporting, by a conveyor of the apparatus, the electronic substrates through a chamber housing of the apparatus including a tunnel extending through multiple processing zones;
  detecting temperatures of the electronic substrates passing proximate to a heat detection system including a plurality of temperature sensors coupled to the chamber housing, the plurality of temperature sensors being arranged in sequence along the tunnel;
  receiving temperature data, including the detected temperatures, from the heat detection system with a controller coupled to the multiple processing zones, the conveyor, and the heat detection system;
  after transporting a first electronic substrate of the electronic substrates through the chamber housing, determining, by the controller, with reference to the detected temperatures of the first electronic substrate, an adjustment to at least one of (a) a heat setting of a heating element within the chamber housing, (b) a speed of the conveyor, and (c) an operational speed of a blower within the chamber housing; and
  prior to transporting a second electronic substrate of the electronic substrates through the chamber housing, performing the determined adjustment;
wherein:
  detecting temperatures includes detecting temperatures of a plurality of components of the first electronic substrate at each of a plurality of locations along the tunnel;
  determining the adjustment includes:
    comparing each detected temperature of each component at each location to an expected temperature for that component at that location, yielding a set of variances; and
    performing an optimization operation configured to adjust hardware settings in the multiple processing zones to reduce the set of variances;
  performing the optimization operation includes operating a trained machine learning model, including inputting data into a trained neural network; and
  the method further comprises training the machine learning model using supervised learning prior to transporting the first electronic substrate through the chamber housing.

2. The method of claim 1, wherein the data input into the trained neural network includes:
  initial hardware settings in the multiple processing zones in effect while the first electronic substrate passed through the chamber housing;

a configuration of components of the first electronic substrate;

thermal characteristics of the components of the first electronic substrate;

a maximum safe temperature for at least one component of the first electronic substrate; and a minimum working temperature for at least one component of the first electronic substrate.

3. The method of claim 2, wherein training the machine learning model using supervised learning includes transporting another plurality of electronic substrates having different configurations, thermal characteristics, maximum safe temperatures, and minimum working temperatures through the chamber housing.

4. The method of claim 1, wherein:

the plurality of temperature sensors includes a plurality of infrared (IR) cameras; and detecting temperatures of the plurality of components of the first electronic substrate at each of the plurality of locations along the tunnel includes imaging the plurality of components of the first electronic substrate at each of the plurality of locations along the tunnel with an IR camera of the plurality of IR cameras.

5. An apparatus configured to join electronic components to electronic substrates, the apparatus comprising:

a chamber housing including a tunnel extending through multiple processing zones;

a conveyor configured to transport the electronic substrates in the tunnel through the multiple processing zones;

a heat detection system including a plurality of temperature sensors coupled to the chamber housing, the plurality of temperature sensors each being configured to detect temperatures of the electronic substrates passing proximate to that temperature sensor; and a controller coupled to the multiple processing zones, the conveyor, and the heat detection system, the controller being configured to:

receive temperature data, including the detected temperatures, from the heat detection system;

after transporting a first electronic substrate of the electronic substrates through the chamber housing, determine, with reference to the detected temperatures of the first electronic substrate, an adjustment to at least one of (a) a heat setting of a heating element within the chamber housing, (b) a speed of the conveyor, and (c) an operational speed of a blower within the chamber housing; and prior to transporting a second electronic substrate of the electronic substrates through the chamber housing, perform the determined adjustment;

wherein:

the plurality of temperature sensors are arranged in sequence along the tunnel;

detecting temperatures includes detecting temperatures of a plurality of components of the first electronic substrate at each of a plurality of locations along the tunnel;

determining the adjustment includes:

comparing each detected temperature of each component at each location to an expected temperature for that component at that location, yielding a set of variances; and performing an optimization operation configured to adjust hardware settings in the multiple processing zones to reduce the set of variances;

performing the optimization operation includes operating a trained machine learning model, including inputting data into a trained neural network; and the machine learning model is trained using supervised learning prior to transporting the first electronic substrate through the chamber housing.

6. The apparatus of claim 5, wherein:

the plurality of temperature sensors includes a plurality of infrared (IR) cameras; and detecting temperatures of the plurality of components of the first electronic substrate at each of the plurality of locations along the tunnel includes imaging the plurality of components of the first electronic substrate at each of the plurality of locations along the tunnel with an IR camera of the plurality of IR cameras.

7. A computer program product comprising a non-transitory computer-readable medium storing instructions, which, when executed by processing circuitry of a controller device coupled to an apparatus configured to join electronic components to electronic substrates, causes the controller device to:

operate the apparatus to transport the electronic substrates through a chamber housing including a tunnel extending through multiple processing zones;

operate the apparatus to detect temperatures of the electronic substrates passing proximate to a heat detection system including a plurality of temperature sensors coupled to the chamber housing, the plurality of temperature sensors being arranged in sequence along the tunnel;

receive temperature data, including the detected temperatures, from the heat detection system;

after transporting a first electronic substrate of the electronic substrates through the chamber housing, determine, with reference to the detected temperatures of the first electronic substrate, an adjustment to at least one of (a) a heat setting of a heating element within the chamber housing, (b) a speed of a conveyor within the chamber housing, and (c) an operational speed of a blower within the chamber housing; and prior to transporting a second electronic substrate of the electronic substrates through the chamber housing, operate the apparatus to perform the determined adjustment;

wherein:

detecting temperatures includes detecting temperatures of a plurality of components of the first electronic substrate at each of a plurality of locations along the tunnel;

determining the adjustment includes:

comparing each detected temperature of each component at each location to an expected temperature for that component at that location, yielding a set of variances; and performing an optimization operation configured to adjust hardware settings in the multiple processing zones to reduce the set of variances;

performing the optimization operation includes operating a trained machine learning model, including inputting data into a trained neural network; and the instructions, when executed by the processing circuitry, further cause the controller device to train the machine learning model using supervised learning prior to transporting the first electronic substrate through the chamber housing.

8. The computer program product of claim 7, wherein, the data input into the trained neural network includes:

initial hardware settings in the multiple processing zones in effect while the first electronic substrate passed through the chamber housing;

a configuration of components of the first electronic substrate;

thermal characteristics of the components of the first electronic substrate;

a maximum safe temperature for at least one component of the first electronic substrate; and a minimum working temperature for at least one component of the first electronic substrate.

9. The computer program product of claim 8, wherein training the machine learning model using supervised learning includes transporting another plurality of electronic substrates having different configurations, thermal characteristics, maximum safe temperatures, and minimum working temperatures through the chamber housing.

* * * * *